United States Patent
Suguro et al.

(10) Patent No.: US 7,084,068 B2
(45) Date of Patent: Aug. 1, 2006

(54) ANNEALING FURNACE, MANUFACTURING APPARATUS, ANNEALING METHOD AND MANUFACTURING METHOD OF ELECTRONIC DEVICE

(75) Inventors: Kyoichi Suguro, Yokohama (JP); Takayuki Ito, Kawasaki (JP); Takaharu Itani, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 10/661,564

(22) Filed: Sep. 15, 2003

(65) Prior Publication Data
US 2004/0266214 A1 Dec. 30, 2004

(30) Foreign Application Priority Data
Jun. 25, 2003 (JP) .......................... P2003-181731

(51) Int. Cl.
*H01L 21/302* (2006.01)
*H01L 21/461* (2006.01)
*C23C 16/00* (2006.01)

(52) U.S. Cl. ............... 438/708; 118/725; 257/E21.328; 257/E21.498

(58) Field of Classification Search ................ 438/707, 438/708
See application file for complete search history.

(56) References Cited

U.S. PATENT DOCUMENTS

| | | | | |
|---|---|---|---|---|
| 4,698,486 A | * | 10/1987 | Sheets ........................ | 219/390 |
| 5,011,794 A | * | 4/1991 | Grim et al. .................. | 438/796 |
| 5,683,518 A | * | 11/1997 | Moore et al. ................ | 118/730 |
| 5,966,594 A | | 10/1999 | Adachi et al. .............. | 438/151 |
| 6,146,135 A | * | 11/2000 | Watanabe et al. ........... | 432/221 |
| 6,329,229 B1 | | 12/2001 | Yamazaki et al. .......... | 438/166 |
| 6,410,090 B1 | * | 6/2002 | Wang ..................... | 427/255.38 |
| 2002/0162505 A1 | * | 11/2002 | Wang ......................... | 118/697 |
| 2003/0017716 A1 | * | 1/2003 | Dietze ........................ | 438/763 |
| 2003/0232495 A1 | * | 12/2003 | Moghadam et al. ........ | 438/623 |
| 2004/0060900 A1 | * | 4/2004 | Waldhauer et al. ............ | 216/2 |
| 2004/0149715 A1 | * | 8/2004 | Timans et al. .............. | 219/390 |

FOREIGN PATENT DOCUMENTS

| | | |
|---|---|---|
| JP | 6-349821 | 12/1994 |
| JP | 07-183234 | 7/1995 |

(Continued)

OTHER PUBLICATIONS

Japanese Office Action, entitled "Notification of Reasons for Refusal," mailed by the Japanese Patent Office on Sep. 27, 2005 in counterpart Japanese Application No. P2003-181731.

*Primary Examiner*—W. David Coleman
(74) *Attorney, Agent, or Firm*—Finnegan, Henderson, Farabow, Garrett & Dunner, L.L.P.

(57) ABSTRACT

An annealing furnace, includes a processing chamber configured to store a substrate; a susceptor located in the processing chamber so as to load the substrate and having an auxiliary heater for heating the substrate at 650° C. or less, the susceptor having a surface being made of quartz; a gas supply system configured to supply a gas required for a thermal processing on the substrate in parallel to a surface of the substrate; a transparent window located on an upper part of the processing chamber facing the susceptor; and a main heater configured to irradiate a pulsed light on the surface of the substrate to heat the substrate from the transparent window, the pulsed light having a pulse duration of approximately 0.1 ms to 200 ms and having a plurality of emission wavelengths.

28 Claims, 20 Drawing Sheets

FOREIGN PATENT DOCUMENTS

| | | | |
|---|---|---|---|
| JP | 08-048595 | * | 2/1996 |
| JP | 09-082696 | | 3/1997 |
| JP | 2002-057151 | | 2/2002 |
| JP | 2003-273103 | | 9/2003 |
| JP | 2004-193368 | | 7/2004 |
| JP | 2004-311827 | | 11/2004 |

* cited by examiner

ANNEALING FURNACE, MANUFACTURING APPARATUS, ANNEALING METHOD AND MANUFACTURING METHOD OF ELECTRONIC DEVICE

CROSS REFERENCE TO RELATED APPLICATIONS

This application is based upon and claims the benefit of priority from prior Japanese Patent Application P2003-181731 filed on Jun. 25, 2003; the entire contents of which are incorporated by reference herein.

BACKGROUND OF THE INVENTION

1. Field of the Invention

The present invention relates to an annealing furnace for processing the surface of an electronic device in the manufacturing process of the electronic device and, in particular, to a manufacturing apparatus and an annealing method of forming a thin insulating film by use of a heating lamp and to a manufacturing method of an electronic device.

2. Description of the Related Art

Large scale integrated (LSI) circuits have been becoming larger to improve their performance, and at the same time, finer elements have been advancing more rapidly than ever. When a metal-insulator-semiconductor field effect transistor (MISFET) is used, the electrical thickness of a gate insulating film is required to become thinner in correspondence to a decrease in a gate length to make the MISFET finer while controlling the threshold voltages thereof. Accordingly, a formation technique and optimization of thin gate insulating films have become extremely important. Especially, a technique of forming thin gate insulating films having an effective oxide thickness (EOT) of 2 nm or less is becoming increasingly important. Herein, EOT represents the thickness of the film converted into that of a silicon oxide ($SiO_2$) film.

For example, a rapid thermal oxidation (RTO) or the like has been utilized as the method for forming ultra thin $SiO_2$ or silicon oxy-nitride ($SiO_xN_y$, referred to as SiON hereinafter) films having an EOT of 2 nm or less on a semiconductor substrate such as silicon (Si), for example, (see U.S. Pat. No. 5,966,594 specification and Japanese Patent Application Laid-Open No. 6-349821). Moreover, for a method for forming an ultra thin insulating film with a thickness of 2 nm or less, an attempt has been made to use oxygen radical (O*) or oxygen ion at a low temperature of 500° C. or less.

If typical halogen lamps are used in the RTO, the temperature rises and falls slowly. Thus, it is difficult to form ultra thin insulating films with a thickness of 2 nm or less with great repeatability at a high oxidation temperature of, for example, approximately 1000° C. In addition, for SiON films which are formed by use of O* or oxygen ion at a low temperature, only insulating films which have high leakage current density of, for example, 100 $A/cm^2$ under the condition of an EOT of 1 nm and an electric field of 4.5 MV/cm are obtained.

In a typical thermal oxidation process of Si substrates, first, a native oxide film on the surface of a Si substrate is removed by wet processing with dilute hydrofluoric acid (HF), ammonium fluoride ($NH_4F$) or the like. However, a 0.5 nm to 1 nm thick native oxide film is formed in an atmosphere in advance of thermal oxidation. Although a Si substrate is installed in a lamp annealing apparatus in a shortest feasible time to prevent the formation of a native oxide film after wet processing, the 0.5 nm to 1 nm thick oxide film is formed by oxygen ($O_2$), mixture gas of $O_2$ and hydrogen ($H_2$) or oxidation gas such as water vapor ($H_2O$) in the atmosphere before the ambient temperature reaches the oxidation temperature.

The native oxide film, which is formed on the surface of the Si substrate, has inferior electrical characteristics. However, if the native oxide film is heated at, for example, 1050° C. or more, the electrical characteristics thereof are improved so that the characteristics are equivalent to those of a thermal oxide film. Thus, the thermal oxide film having good electrical characteristics can be formed in the RTO, but it is extremely difficult to control the thickness of the film to be 2 nm or less since the native oxide film is formed before the thermal oxidation process.

SUMMARY OF THE INVENTION

A first aspect of the present invention inheres in an annealing furnace including a processing chamber configured to store a substrate; a susceptor located in the processing chamber so as to load the substrate and having an auxiliary heater for heating the substrate at 650° C. or less, the susceptor having a surface being made of quartz; a gas supply system configured to supply a gas required for a thermal processing on the substrate in parallel to a surface of the substrate; a transparent window located on an upper part of the processing chamber facing the susceptor; and a main heater configured to irradiate a pulsed light on the surface of the substrate to heat the substrate from the transparent window, the pulsed light having a pulse duration of approximately 0.1 ms to 200 ms and having a plurality of emission wavelengths.

A second aspect of the present invention inheres in a manufacturing apparatus including a first cassette chamber to place a wafer cassette for storing a substrate; a transfer chamber connected to the first cassette chamber, having a transfer robot for transferring the substrate; a first processing apparatus having a first processing chamber connected to the transfer chamber and configured to store the substrate, a first susceptor located in the first processing chamber so as to load the substrate transferred by the transfer robot, a first introduction conduit supplying a first gas to a surface of the substrate, a first transparent window located on an upper part of the first processing chamber, and a first main heater irradiating a pulsed light on the surface of the substrate to heat the substrate from the first transparent window, the pulsed light having a duration of approximately 0.1 ms to 200 ms and having a plurality of emission wavelengths; and a second cassette chamber to place another wafer cassette storing the substrate transferred from the first processing apparatus by the transfer robot.

A third aspect of the present invention inheres in an annealing method including introducing at least one of an oxidation gas and a nitridation gas to a substrate loaded on a susceptor in a processing chamber; and heating a surface of the substrate with a pulse duration of approximately 0.1 ms to 200 ms to perform at least one of oxidation and nitridation.

A fourth aspect of the present invention inheres in a manufacturing method of an electronic device including cleaning a substrate by a wet processing; loading the substrate on a first susceptor in a first processing apparatus; introducing a first gas to the substrate loaded on the first susceptor; and performing a first processing of at least one of oxidation and nitridation by heating a surface of the substrate with a pulse duration of approximately 0.1 ms to 200 ms.

DETAILED DESCRIPTION OF THE INVENTION

Figure 1:
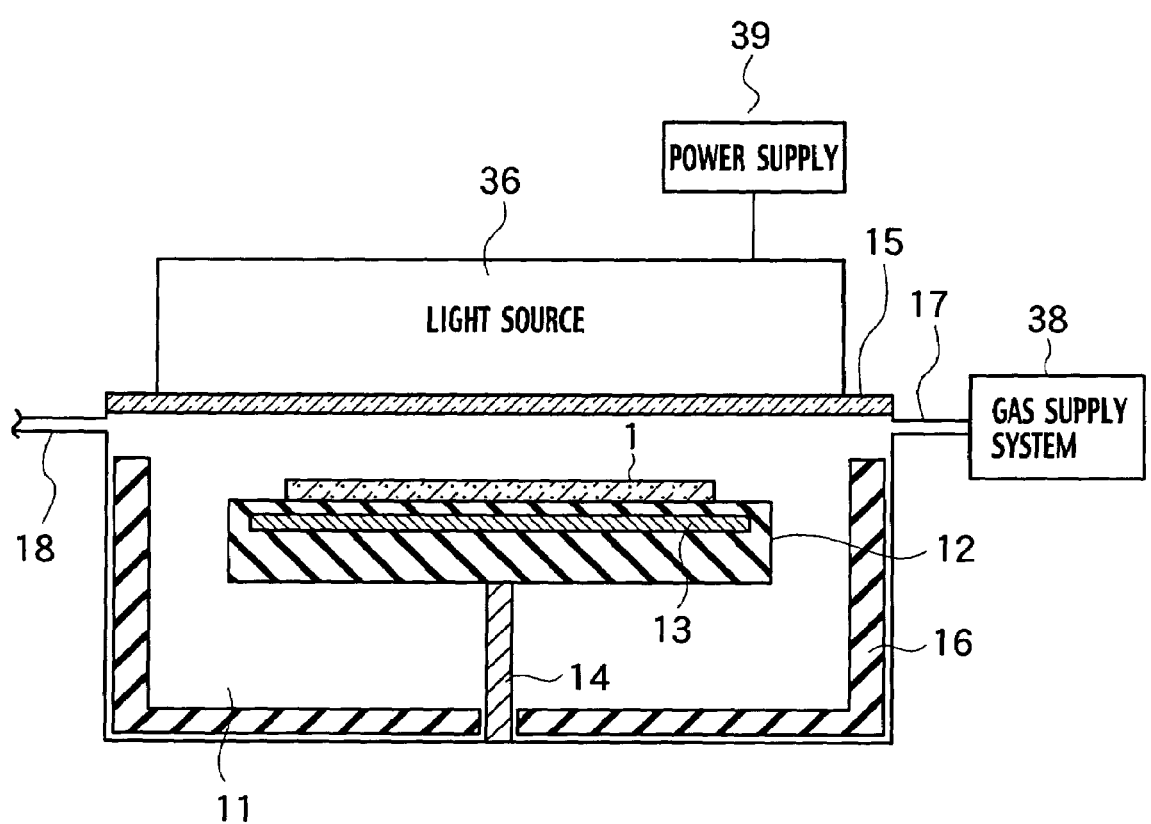
FIG. 1 is a schematic view depicting an example of a processing apparatus according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

As shown in FIG. 1, an annealing furnace according to a first embodiment of the present invention includes a processing chamber 11, a susceptor 12, an introduction conduit 17, an exhaust conduit 18, a transparent window 15 and a main heater 36. Herein, a substrate 1 such as a semiconductor substrate is processed in the processing chamber 11. The susceptor 12, on which the substrate 1 is loaded, is located in the processing chamber 11. The introduction conduit 17 supplies gas in parallel to the surface of the substrate 1. The exhaust conduit 18 exhausts gas from the processing chamber 11. The transparent window 15 is located facing the susceptor 12 on the top of the processing chamber 11. The main heater 36 irradiates the surface of the substrate 1 from the transparent window 15 with pulsed light.

The processing chamber 11 is made of a metal such as stainless steel. The susceptor 12, on which the substrate 1 is loaded, is located on the top of a support shaft 14 installed perpendicular to the bottom of the processing chamber 11. Aluminum nitride (AlN), ceramic, quartz or the like is used for the susceptor 12, and an auxiliary heater 13 for heating the substrate 1 is incorporated in the susceptor 12. For the susceptor 12, aluminum nitride (AlN), ceramics, stainless steel or the like, the surface of which being protected by quartz, may also be used. For the auxiliary heater 13, a buried metal heater such as a nichrome wire, heating lamp or the like is used, and the temperature of the auxiliary heater 13 is controlled by a control system (not shown) disposed outside the processing chamber 11. The control system enables the susceptor 12 to rotate by use of the support shaft 14.

On side and bottom inner walls in the processing chamber 11, a protective member 16 such as quartz is installed to prevent oxidation or corrosion. The introduction conduit 17 and the exhaust conduit 18 are each connected to the top portion of sidewalls in the processing chamber 11, substantially facing each other. To the introduction conduit 17, a gas supply system 38 having a variety of gas sources for processing the substrate 1 is connected.

In addition, the main heater 36 such as a flash lamp, which irradiates the surface of the substrate 1 with pulsed light to heat, is located on the top of the processing chamber 11 through a transparent window 15 such as synthetic quartz. To the main heater 36, a power supply 39 such as a pulse power supply which drives the main heater 36 with an extremely short pulse, is connected. The transparent window 15 transmits light from the main heater 36 to irradiate the substrate 1 as well as isolates the processing chamber 11 from the main heater 36 to hermetically seal the processing chamber 11.

Figure 2:
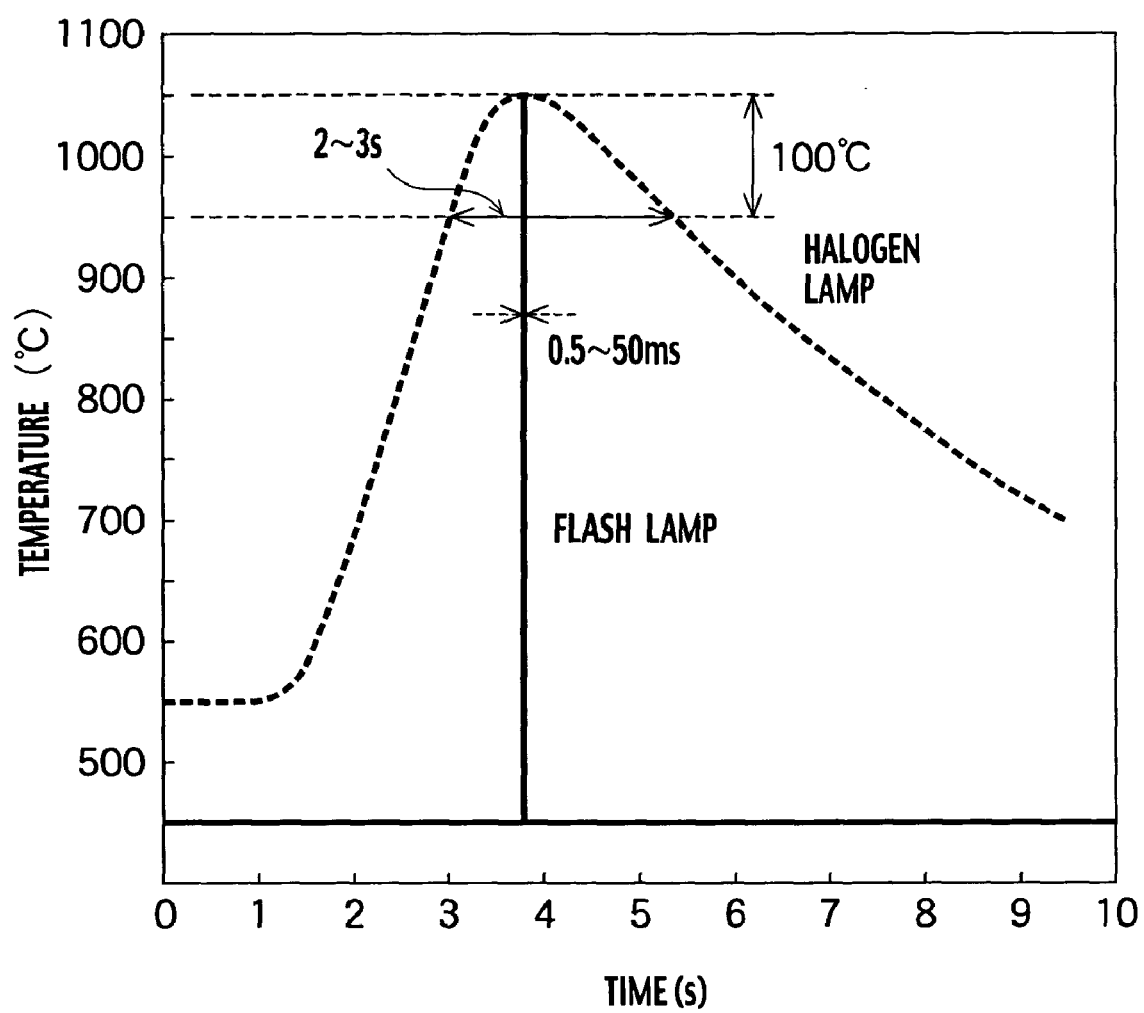
FIG. 2 is a graph depicting a comparison between a heating characteristic of a main heater of the processing apparatus according to the first embodiment of the present invention and that of a typical infrared lamp.
Figure 3:
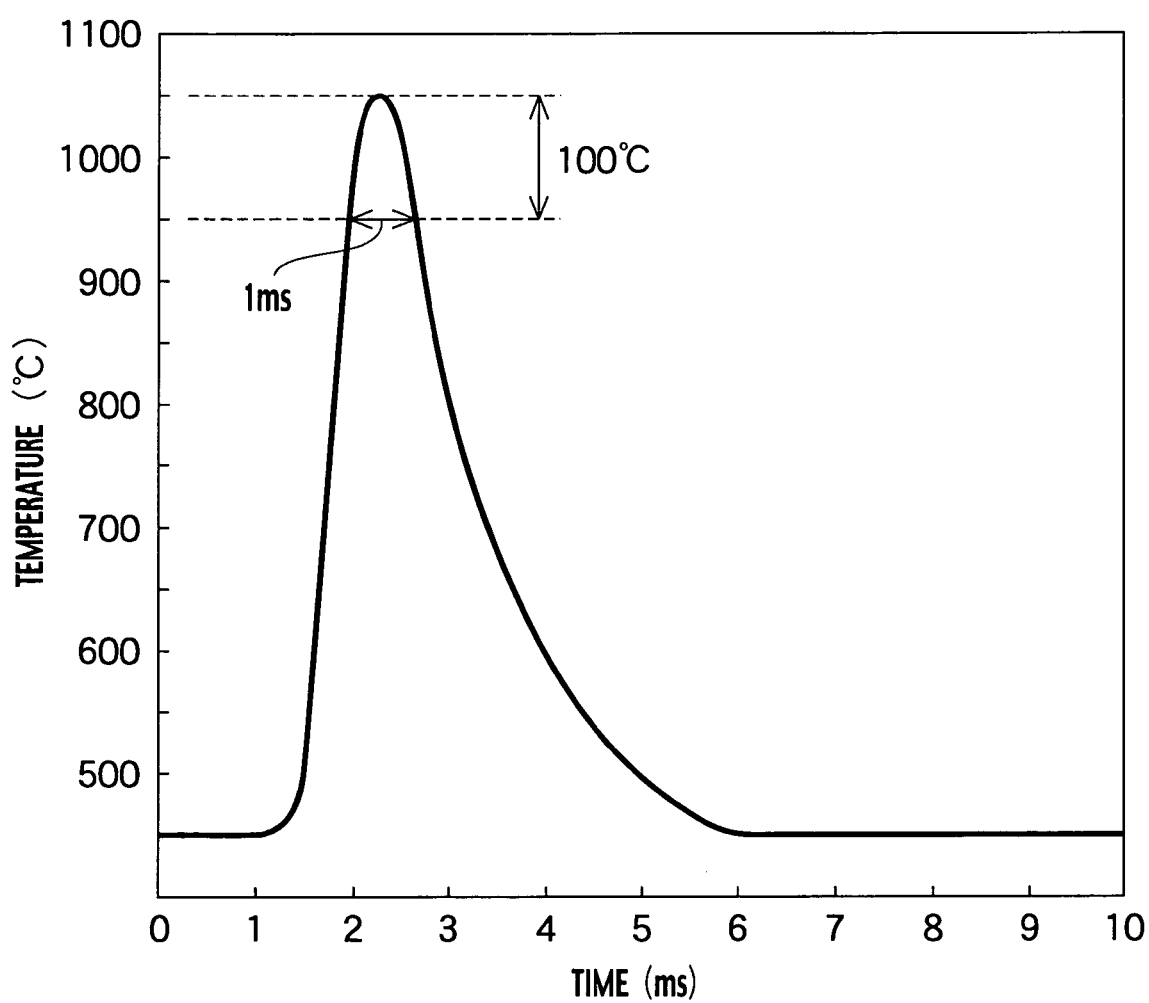
FIG. 3 is a graph depicting an example of the heating characteristic of the main heater of the processing apparatus according to the first embodiment of the present embodiment.

As shown in FIG. 2, a temperature profile heated by the flash lamp used for the main heater 36 of the first embodiment exhibits a more rapid temperature rise and fall than those of an infrared lamp such as a halogen lamp. Herein, a high speed pyrometer is employed to measure the surface temperature of the substrate 1. For example, it takes 10 seconds or more, for example, approximately 15 seconds, for the halogen lamp light to increase and decrease the temperature from 500° C. to 1050° C. Moreover, 2 to 3 seconds are required to increase and decrease by 100° C. between 950° C. and 1050° C. By contrast, it takes 0.1 ms to 200 ms, optimally 0.5 ms to 50 ms for the flash lamp light to increase and decrease the temperature from 450° C. to 1200° C. When the duration for the flash lamp light to increase and decrease the temperature is only 0.1 ms, the maximum temperature may be 950° C. or less. Additionally, it is difficult to form an ultra thin insulating film described later when the duration for the flash lamp light to increase and decrease the temperature is 200 ms or more. As shown in FIG. 3, the flash lamp light of the first embodiment increases and decreases the temperature from 450° C. to 1050° C. in approximately 5 ms. Moreover, the flash lamp light increases and decreases the temperature by 100° C. between 950° C. and 1050° C., for example, in approximately 1 ms. Thus, according to the first embodiment, the surface treatment of the substrate 1 such as oxidation can be processed in an extremely short period of time at a high temperature. Therefore, it is possible to form an ultra thin insulating film.

A case where a thermal oxide (SiO2) film is formed on a Si substrate 1 is described as an example of a method of forming an insulating film according to the first embodiment. The Si substrate 1, from which a native oxide film is removed by, for example, wet processing, is loaded on the susceptor 12. The Si substrate 1 is preheated by the auxiliary heater 13 in the susceptor 12 while an inert gas such as nitrogen (N2) or argon (Ar) is supplied to the Si substrate 1 from the gas supply system 38 through the introduction conduit 17. Accordingly, moisture and an air component adhered on the Si substrate 1 are purged. It is possible to preheat the substrate 1 at a temperature of 100° C. to 700° C., but it is desirable to preheat at a temperature from 200° C. to 650° C. When the preheating temperature is less than 200° C., the irradiation energy of the flash lamp for oxidation becomes excessively large, thereby causing crystal defects in the si substrate 1. When the Si substrate 1 is preheated at more than 650° C., a 0.5 nm to 1 nm thick oxidation film is formed on the surface of the Si substrate 1 prior to the irradiation of the flash lamp due to the existence of oxidation gases in the processing chamber 11. In the first embodiment, the preheating temperature of 400° C. to 550° C. is employed. Next, the gas supply system 38 supplies an oxidation gas such as $O_2$, water vapor ($H_2O$), or nitrogen oxide ($NO_x$) to the surface of the Si substrate 1 preheated on the susceptor 12 through the introduction conduit 17. The Si substrate 1 is heated at 1050° C. by the main heater 36, thereby forming the thermal oxide film on the surface of the Si substrate 1. The energy density of the irradiation light supplied from the main heater 36 is, for example, 5 J/cm² to 100 J/cm², and optimally 20 J/cm² to 30 J/cm². Further, the irradiation time of the flash lamp light is set to approximate 1 ms.

Figure 4:
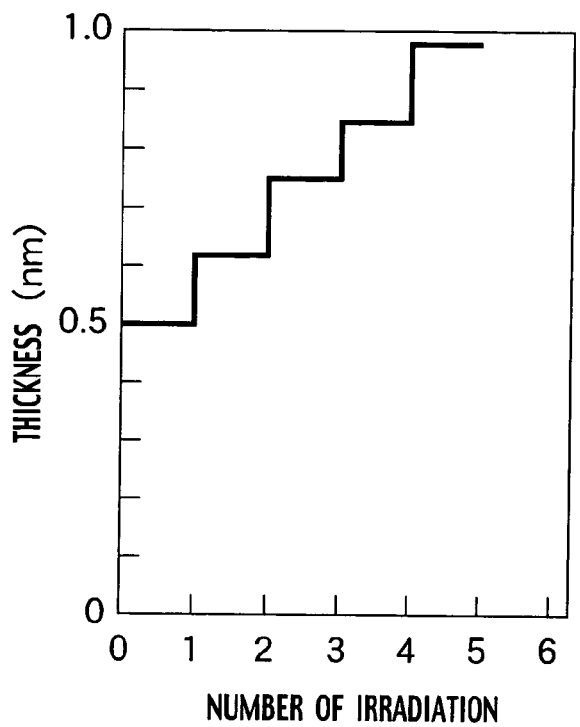
FIG. 4 is a graph depicting an example of a relationship between the thickness of an insulating film formed by the processing apparatus and the number of times that the main heater irradiates according to the first embodiment of the present invention.

FIG. 4 shows the measurement result of the thickness of the grown oxide film by use of an ellipsometer. In the first embodiment, the surface of the Si substrate 1 is rinsed with pure water after immersing in a dilute HF solution, and the Si substrate 1 is loaded in the processing chamber 11 immediately after the Si substrate 1 is dried. However, an approximately 0.5 nm thick native oxide film has already been formed on the surface before the lamp heats the Si substrate 1. As shown in FIG. 4, the thickness of the oxide film increases stepwise in accordance with the number of the irradiation of the main heater 36 by a layer unit of 0.1 nm to 0.14 nm. Therefore, according to the first embodiment, the thermal oxide film with a thickness of 2 nm or less can be formed with high repeatability.

In the first embodiment, for example, to form a SiON film, a nitridation gas such as a $N_2$ gas, an ammonia ($NH_3$) gas, or a compound gas containing activated nitrogen (N*) is supplied to the surface of the Si substrate 1 with an oxidation gas from the gas supply system 38. The Si substrate 1 is heated at, for example, 1050° C. by the main heater 36 while the oxidation gas and the nitridation gas are supplied, thereby forming the SiON film on the surface of the Si substrate 1. Moreover, a high dielectric constant insulating film such as a nitrogen added hafnium silicate (HfSiNO, e.g., an atom ratio of Hf:Si:N:O=1:0.5:0.1:2.9) may be deposited on the thermal oxide film or SiON film. In order to deposit the HfSiNO film, the Si substrate 1 is loaded in a chemical vapor deposition (CVD) apparatus after the thermal oxide or SiON film is formed. Then, the HfSiNO film is deposited by supplying, for example, an $O_2$ gas, a Si alkoxidation gas and a Hf alkoxidation gas.

Figure 5:
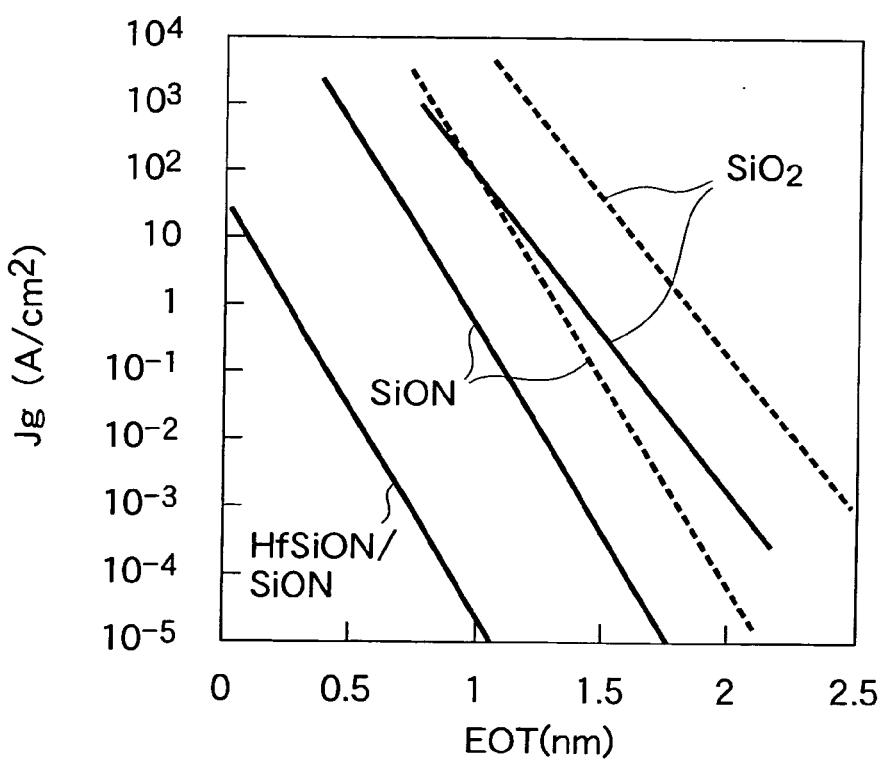
FIG. 5 is a graph depicting an example of a relationship between leakage current and an effective oxide thickness (EOT) of the insulating film formed by a manufacturing apparatus according to the first embodiment of the present invention.

In FIG. 5, relationships between leakage currents Jg and the EOTs of the thermal oxide and SiON films formed by the method of forming an insulating film according to the first embodiment are indicated by solid lines. In addition, for comparison, the leakage currents Jg of the thermal oxide and SiON films, which are formed at 500° C. or less, are indicated by dotted lines. In the method of forming the insulating film according to the first embodiment, the native oxide film formed on the surface of the Si substrate 1 is heated up to 1050° C. by the main heater 36. The film property of the native oxide film is improved by the high temperature treatment of approximately 1000° C. or over, whereby the leakage current Jg thereof has almost the same property as that of the thermal oxide film. As shown in FIG. 5, for example, where EOT is 1 nm, the leakage currents Jg of the thermal oxide and SiON films formed at a low temperature are 10000 A/cm2 and 100 A/cm2, respectively, whereas the leakage currents Jg of the thermal oxide and SiON films formed by the forming method according to the first embodiment are 100 A/cm2 and 1 A/cm2, respectively. Specifically, the leakage currents Jg of the SiO2 and SiON films formed by the forming method according to the first embodiment is decreased by two digits compared with those formed at low temperature. Moreover, the leakage currents Jg of the SiON film, on which the HfSiNO film is deposited, is 1 A/cm2 even EOT=0.7 nm. Thus, an even lower leakage current Jg can be obtained.

The processing apparatus according to the first embodiment makes it possible to form an ultra thin insulating film having excellent electrical characteristics with high repeatability.

SECOND EMBODIMENT

Figure 6:
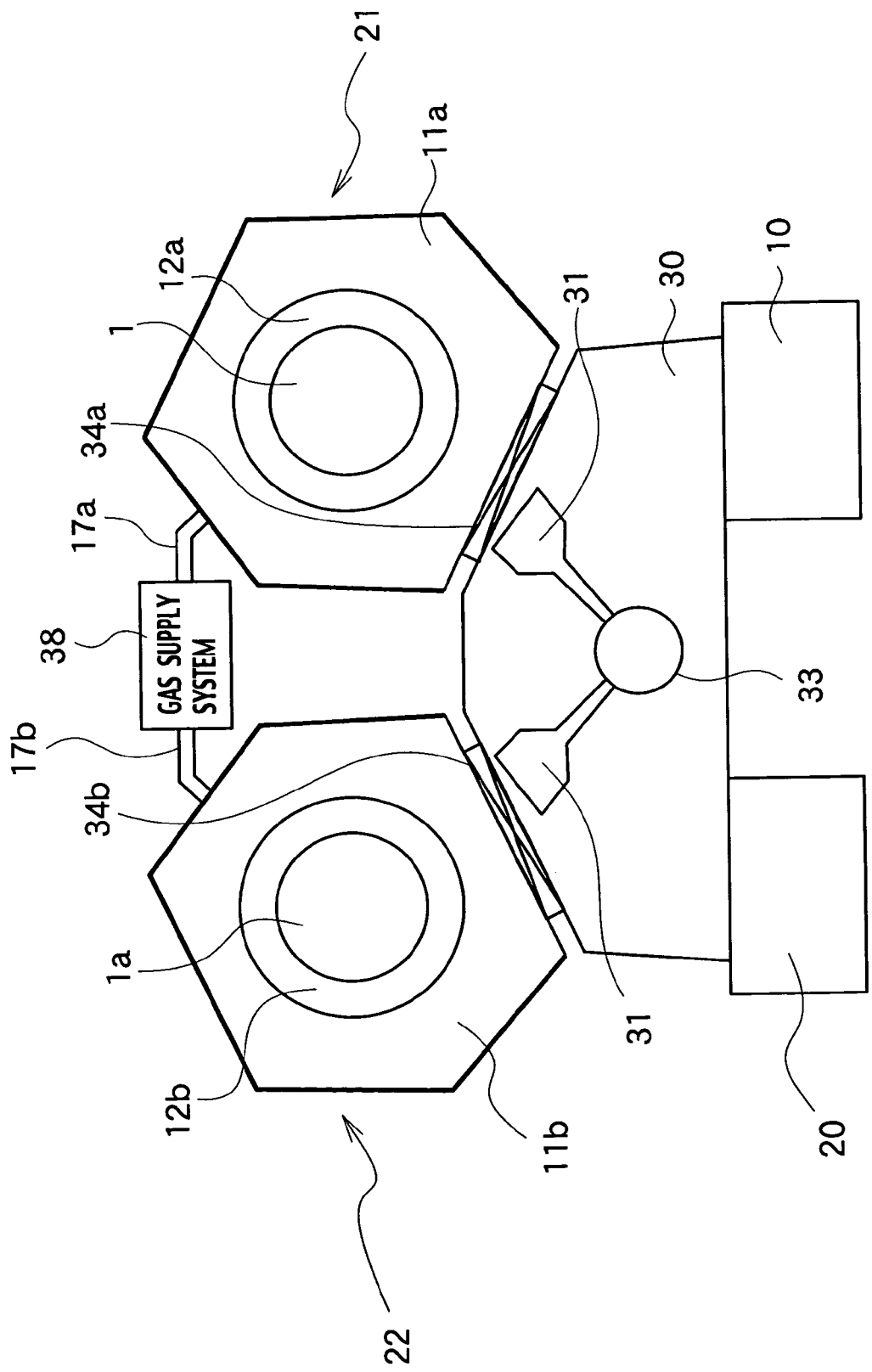
FIG. 6 is a schematic view depicting an example of a manufacturing apparatus according to a second embodiment of the present invention.

As shown in FIG. 6, in a manufacturing apparatus according to a second embodiment of the present invention, first and second processing apparatuses 21 and 22 are connected to a transfer chamber 30 through gate valves 34a and 34b, respectively. The first processing apparatus 21 has a first processing chamber 11a in which a first susceptor 12a is located, and a substrate 1 is loaded on the first susceptor 12a. The second processing apparatus 22 has a second processing chamber 11b in which a second susceptor 12b is located, and a substrate 1a is loaded on the second susceptor 12b. To the first and second processing chambers 11a and 11b, first and second introduction conduits 17a and 17b are connected to supply a variety of gases from a gas supply system 38. To the transfer chamber 30, first and second cassette chambers 10 and 20 are installed. In the first cassette chamber 10, a wafer cassette storing the substrates 1 and 1a is placed. In the second cassette chamber 20, a wafer cassette storing the substrates 1 and 1a processed by the first processing apparatus 21 or the second processing apparatus 22 is placed. Further, in the interior of the transfer chamber 30, a plurality of transfer robots 31 are located on a rotation shaft 33, which transfer the substrates 1 and 1a between the first cassette chamber 10 and the first processing chamber 11a and between the second cassette chamber 20 and the second processing chamber 11b, respectively. The plurality of transfer robots 31 have expandable arms which can rotate around the rotation shaft 33 to transfer the substrates between respective chambers independently. Herein, the first and second cassette chambers 10 and 20 may be pod open/close units employing local cleaning technique such as a front opening unified pod (FOUP) or standard mechanical interface (SMIF).

Figure 7:
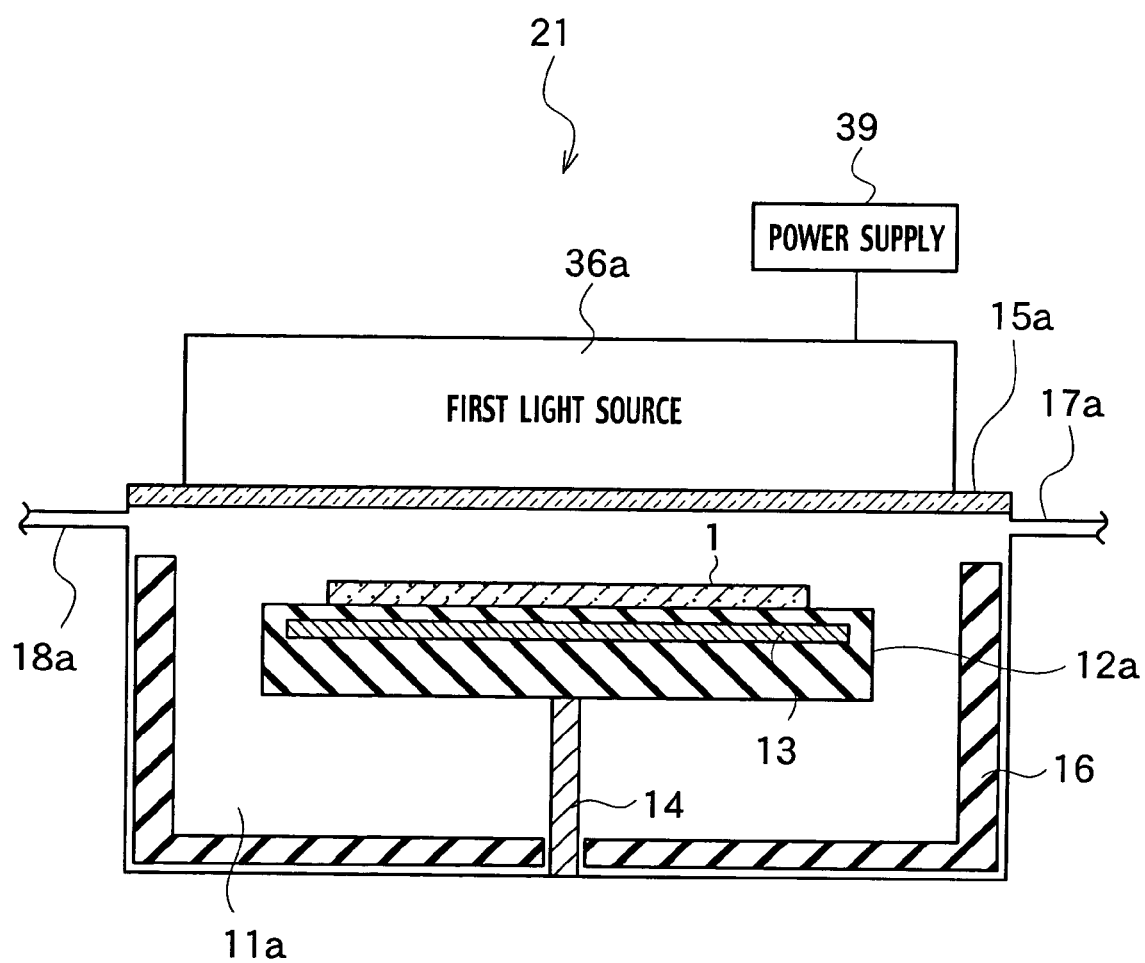
FIG. 7 is a schematic view depicting an example of a first processing apparatus according to the second embodiment of the present invention.
Figure 8:
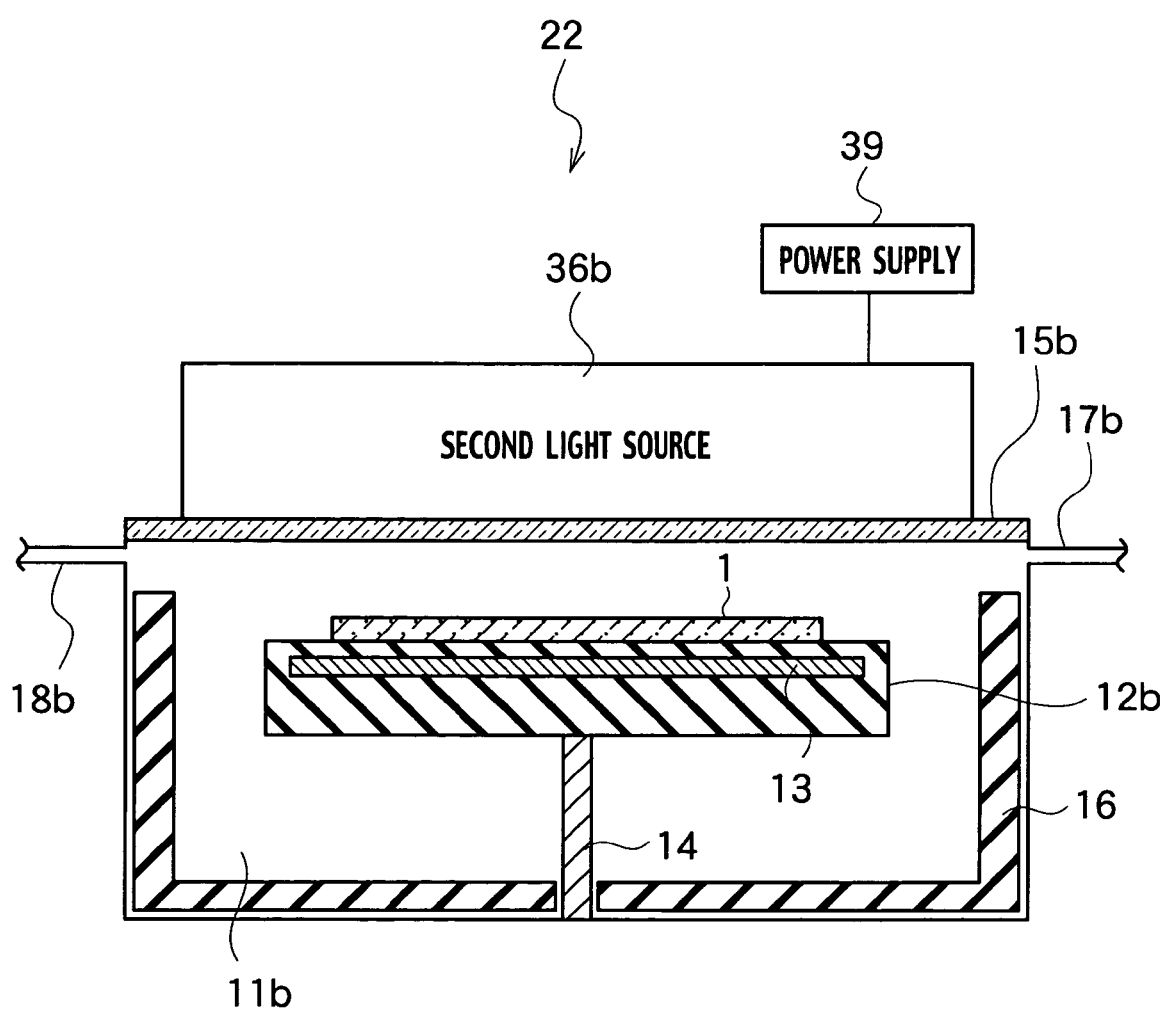
FIG. 8 is a schematic view depicting an example of a second processing apparatus according to the second embodiment of the present invention.

As shown in FIG. 7, the first processing apparatus 21 includes the first processing chamber 11a, a first susceptor 12a, the first introduction conduit 17a, the first exhaust conduit 18a, a first transparent window 15a, and a first main heater 36a. Herein, the substrate 1 is subjected to the first surface processing in the first processing chamber 11a. The first susceptor 12a, on which the substrate 1 is loaded, is located in the first processing chamber 11a. The first introduction conduit 17a supplies gas in parallel to the surface of the substrate 1. The first exhaust conduit 18a exhausts gas from the first processing chamber 11a. The first transparent window 15a is located on top of the first processing chamber 11a, facing the first susceptor 12a. The first main heater 36a irradiates the surface of the substrate 1 with light from the first transparent window 15a. As shown in FIG. 8, the second processing apparatus 22 includes the second processing chamber 11b, a second susceptor 12b, the second introduction conduit 17b, the second exhaust conduit 18b, a second transparent window 15b, and a second main heater 36b. Herein, the substrate 1 is subjected to a second surface processing in the second processing chamber 11b. The susceptor 12b, on which the substrate 1 is loaded, is located in the second processing chamber 11b. The second introduction conduit 17b supplies gas in parallel to the surface of the substrate 1. The second exhaust conduit 18b exhausts gas from the second processing chamber 11b. The second transparent window 15b is located on the top of the second processing chamber 11b, facing the second susceptor 12b. The second main heater 36b irradiates the surface of the substrate 1 with light from the second transparent window 15b. Thus, the first and second processing apparatuses 21 and 22 used in the second embodiment have the same construction as those of the first embodiment. Therefore, redundant descriptions will be omitted.

In the manufacturing apparatus according to the second embodiment, both first and second main heaters 36a and 36b are flash lamps which can irradiate the surfaces of the substrates 1 with pulsed light to rapidly increase/decrease the temperature thereof, for example, in 0.5 ms to 50 ms. Therefore, by irradiating the surface of the substrate 1 with a flash lamp light to heat at, for example, 1050° C. while oxidation or nitridation gases is supplied to the first or second processing chamber 11a or 11b, it is possible to form an ultra thin insulating film having an EOT of 2 nm or less with excellent electrical characteristics.

In the second embodiment, the plurality of transfer robots 31 may transfer the plurality of the substrates 1 and 1a to the first and second processing chambers 11a and 11b to perform the same processings for the substrates 1 and 1a in the first and second processing apparatuses 21 and 22 simultaneously. Alternatively, the substrate 1 may be subjected to, for example, the first surface processing in the first processing chamber 11a and transferred to the second processing chamber 11b by use of the transfer robot 31, to be subjected to the second surface processing. Moreover, it is obvious that the second surface processing may be performed in the second processing chamber 11b initially, and thereafter, the first surface processing may be performed in the first processing chamber 11a.

Figure 9:
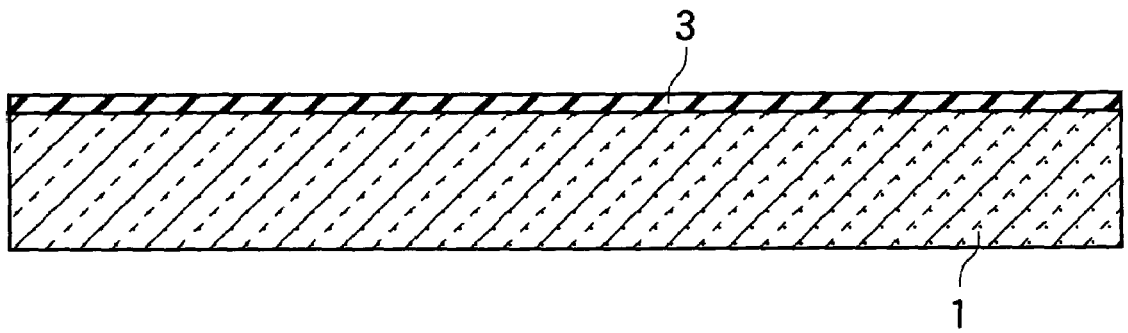
FIGS. 9–11 are cross-sectional views explaining a processing method according to the second embodiment of the present invention.
Figure 10:
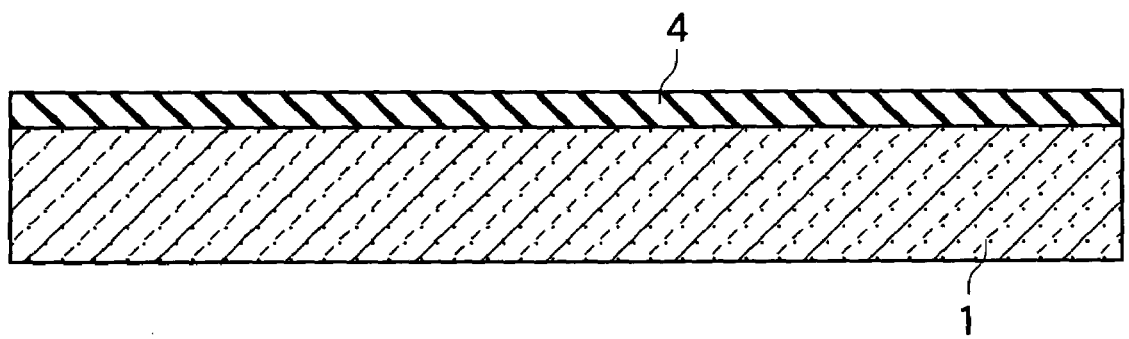
Figure 11:
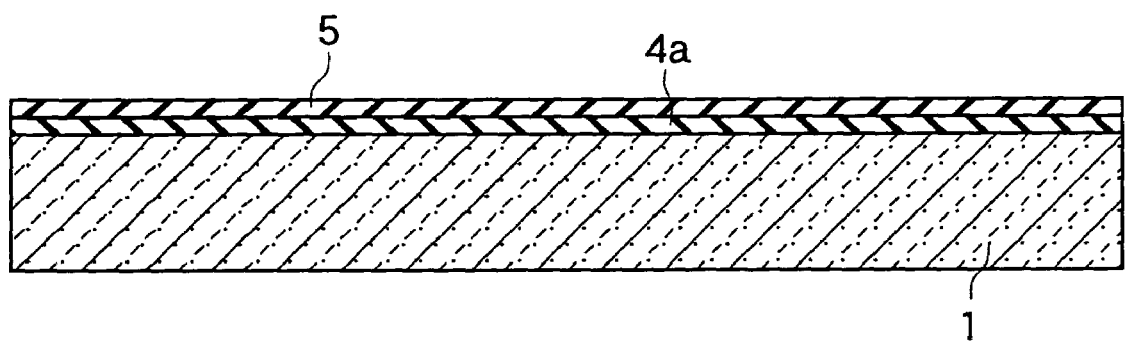

Next, in the second embodiment, the method of forming SiON/SiO$_2$ film on the surface of the Si substrate 1 will be described with reference to FIGS. 9 to 11.

(1) In the first cassette chamber 10 shown in the FIG. 6, the wafer cassette storing the substrate 1, from which a native oxide film is removed by wet cleaning, is placed. The Si substrate 1 is transferred to the first processing chamber 11a from the first cassette chamber 10 through the transfer chamber 30 by the transfer robot 31. Desirably, before transferring, the Si substrate 1 is controlled by a notch or an orientation flat, which indicates the orientation of the Si substrate 1, to be positioned within ±5° relative to a certain direction to stabilize the processing.

(2) The Si substrate 1 transferred to the first processing chamber 11a is loaded on the first susceptor 12a to be preheated by an auxiliary heater 13 shown in FIG. 7. During the preheating, inert gas such as N2 or Ar is supplied to the first processing chamber 11a to purge moisture and atmospheric components adhered on the surface layer of the Si substrate 1. The preheating temperature ranges from 200° C. to 500° C. Note that, as shown in FIG. 9, a new native oxide film 3 with a thickness of approximately 0.5 nm is formed on the surface of the Si substrate 1 before or during the preheating.

(3) Oxidation gas such as O$_2$, H$_2$O or nitric oxide (NO) is supplied to the surface of the Si substrate 1 after the preheating temperature stabilizes to within ±5° C. While the oxidation gas is supplied to the Si substrate 1, the first main heater 36a attached above the Si substrate 1 is turned on, and irradiates the Si substrate 1 with light for approximate 1 ms to heat the substrate 1 to approximately 1050° C. After the first main heater 36a irradiates the substrate 1 for the predetermined number of times, a first insulating film 4, which is a thermal oxide film with a thickness of approximately 1.5 nm, is formed as shown in FIG. 10.

(4) Next, the Si substrate 1 is transferred from the first processing chamber 11a to the second processing chamber 11b by the transfer robot 31. The Si substrate 1 is preheated to the desired temperature, for example, 400° C. to 450° C. on the second susceptor 12b. Inert gas such as N2 or Ar is supplied to the Si substrate 1 during preheating.

(5) After the preheating temperature stabilizes, a nitridation gas such as an N$_2$ gas, an NH$_3$ gas or a compound gas containing active nitride is supplied to the surface of the Si substrate 1. Thereafter, the second main heater 36b is turned on to irradiate the Si substrate 1 with light for approximately 1 ms and to heat the substrate 1 to approximately 1050° C. A surface layer of the first insulating film 4 is nitrided by thermal treatment of the second main heater 36b. Consequently, as shown in FIG. 11, a second insulating film 5, which is a SiON film with the thickness of approximately 0.4 nm, is formed on the first insulating film 4a. The thickness of the first insulating film 4a is reduced to approximately 1 nm. The EOT of the SiON/SiO2 film including the formed first and second insulating films 4a and 5 is approximately 1.8 nm.

(6) The Si substrate 1, in which the insulating film formation processing is completed, is transferred to the second cassette chamber 20 having the wafer cassette therein by the transfer robot 31.

Herein, the oxidation and nitridation processings are performed in the first and second processing chambers 11a and 11b, respectively, but the oxidation and nitride processings may continuously be performed in the first or second processing chamber 11a or 11b by switching the oxidation gas to the nitridation gas without transferring the Si substrate 1.

As described above, the method of forming an insulating film according to the second embodiment makes it possible to form an ultra thin insulating film having an EOT of 2 nm or less with excellent electrical characteristics.

FIRST MODIFICATION OF THE SECOND EMBODIMENT

Figure 12:
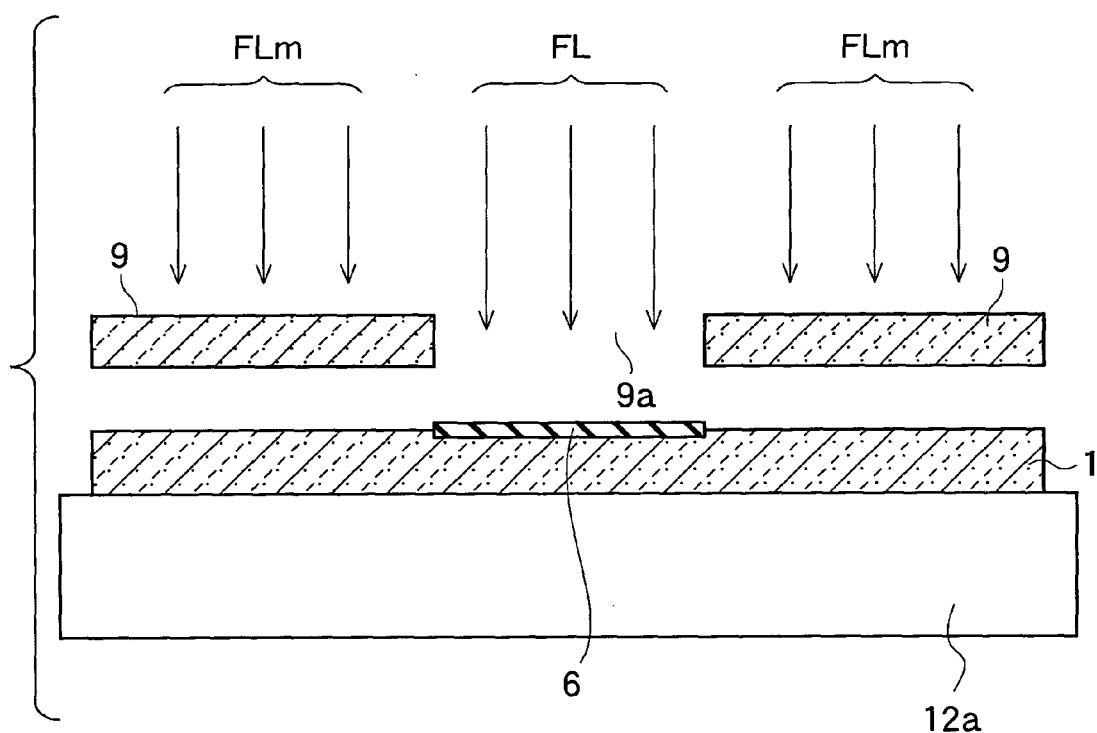
FIG. 12 is a view illustrating an example of the processing method according to a first modification of the second embodiment of the present invention.

As shown in the FIG. 12, in a method of forming an insulating film according to a first modification of the second embodiment of the present invention, an insulating film is formed by positioning a stencil mask 9 made of Si, silicon carbide (SiC) or the like above a substrate 1 and irradiating with flash lamp light FL and FLm. The flash lamp light FLm, which irradiates portion other than an opening 9a of the stencil mask 9, does not transmit onto the substrate 1. Meanwhile, the flash lamp light FL, which irradiates the opening 9a, can transmit so as to heat locally a portion corresponding to the opening 9a of the substrate 1 loaded on the susceptor 12. For example, the substrate 1 is irradiated through the opening 9a by the flash lamp light FL to be heated to approximately 1050° C. while oxidation gas flows, and thus, an insulating film 6 which is a thermal oxide film is selectively formed. By use of the stencil mask 9, the first modification of the second embodiment differs from the second embodiment in that an ultra insulating film 6 is selectively formed on a region corresponding to the opening 9a of the stencil mask 9. Other than that, the first modification of the second embodiment is of the same as the second embodiment, and redundant description will be omitted.

In the first modification of the second embodiment, the stencil mask 9 is stored in a transfer chamber 30 shown in FIG. 6 in advance. For example, the stencil mask 9 is attached to a mask holder (not shown) in the first processing chamber 11a shown in FIG. 7 by the transfer robot 31. The substrate 1 is loaded on a susceptor 12a while being 10 μm to several hundred μm away from the stencil mask 9. An alignment is performed above the susceptor 12a by use of an optical alignment apparatus (not shown) to form the insulating film 6 on a prescribed region of the substrate 1. Herein, it is obvious that a storage place of the stencil mask 9 may not be the transfer chamber 30 but, for example, a storage chamber or the like connected to the transfer chamber 30.

By use of the method of forming an insulating film according to the first modification of the second embodiment, it is possible to form an insulating film having partially different thicknesses on the surface of the Si substrate 1. A description will be given of the method of forming an insulating film having different thicknesses within a portion of a region on the Si substrate 1 with reference to FIGS. 13 to 15.

Figure 13:
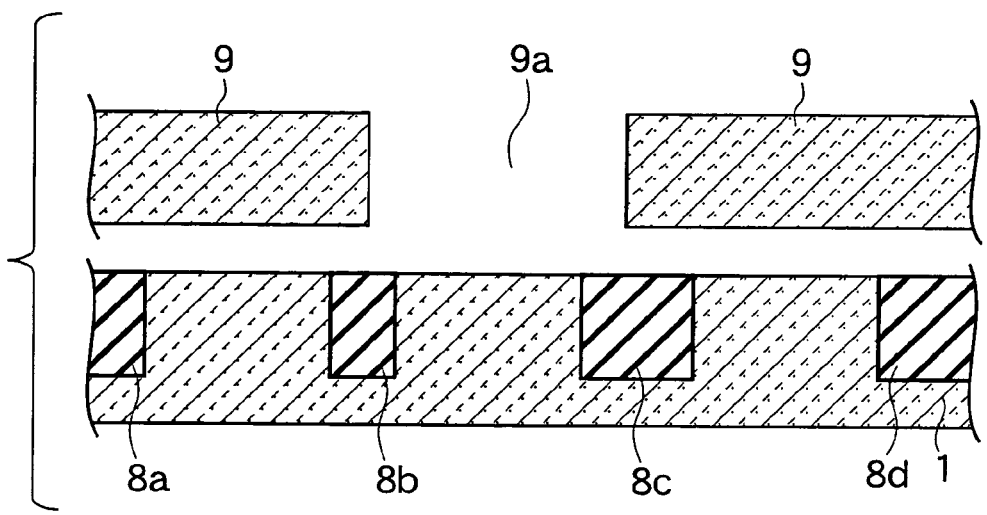
FIGS. 13–15 are cross-sectional views explaining a processing method according to the first modification of the second embodiment of the present invention.

(1) First, as shown in FIG. 13, the Si substrate 1, in which isolation insulating films 8a to 8d are formed, and the stencil mask 9 are loaded in the first processing chamber 11a shown in FIG. 6. The stencil mask 9 is positioned above an upper side of the Si substrate 1. The opening 9a of the stencil mask 9 is aligned with a region in which a thick insulating film is formed, for example, a region between the isolation insulating films 8b and 8c.

Figure 14:
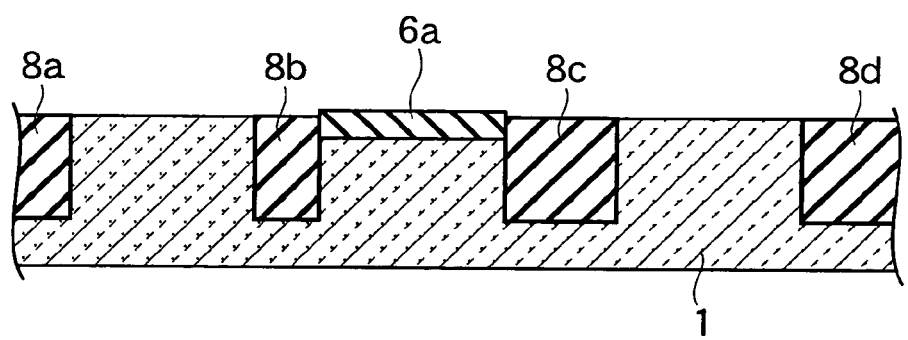

(2) The flash lamp light irradiates the Si substrate 1 through the opening 9a of the stencil mask 9 while oxidation gas is supplied to the first processing chamber 11a. As shown in FIG. 14, the insulating film 6a, a thermal oxide film, is selectively formed on a region which is locally heated by the flash lamp light irradiation and positioned between the isolation insulating films 8b and 8c.

Figure 15:
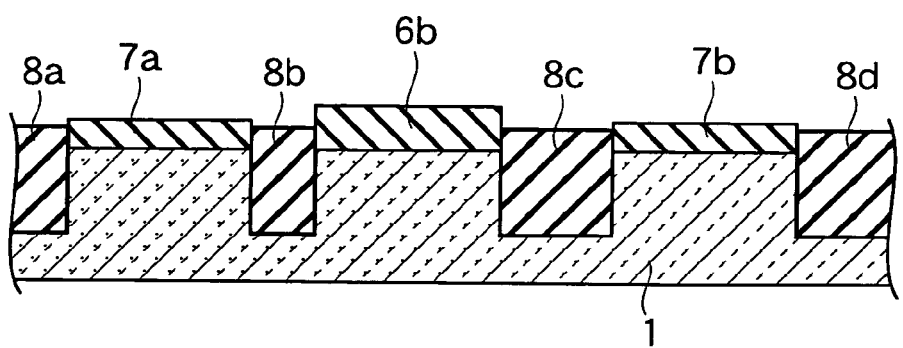

(3) Next, the stencil mask 9 is removed from the first processing chamber 11a by the transfer robot 31. Thereafter, the flash lamp light irradiates the entire surface of the Si substrate 1 while oxidation gas is supplied to the Si substrate 1. As a result, as shown in FIG. 15, a first insulating film 6b thicker than the insulating film 6a is formed between the isolation insulating films 8b and 8c. Second insulating films 7a and 7b thinner than the first insulating film 6b, are formed between the isolation insulating films 8a and 8b and between the isolation insulating films 8c and 8d, respectively.

The first modification of the second embodiment makes it possible to form ultra thin insulating layers having different thicknesses on desired regions in the Si substrate 1.

SECOND MODIFICATION OF THE SECOND EMBODIMENT

In a method of forming an insulating film according to a second modification of the second embodiment of the present invention, similar to the first modification of the second embodiment, ultra thin insulating film layers having different thicknesses are formed on predetermined regions of the substrate 1. In the first modification of the second embodiment, the stencil mask 9 is used. However, in the second modification of the second embodiment, ultra thin insulating films having different thicknesses are formed by forming a doped layer on a portion of a region of the substrate 1 without a stencil mask 9. Other than that, the second modification of the second embodiment is the same as the first modification of the second embodiment. Thus, redundant descriptions will be omitted.

In a Si semiconductor layer, a doped layer with a halogen element such as fluorine (F), chlorine (Cl), bromine (Br) and iodine (I), or with oxygen enhances the thermal oxidation rate. When the doped layer with such as the halogen element or oxygen is locally formed in the Si substrate 1, ultra thin insulating films having different thicknesses can be formed on the Si substrate 1 by irradiating with flash lamp light. A description will be given of the method of forming an insulating film according to the second modification of the second embodiment with reference to FIG. 16 to 18.

Figure 16:
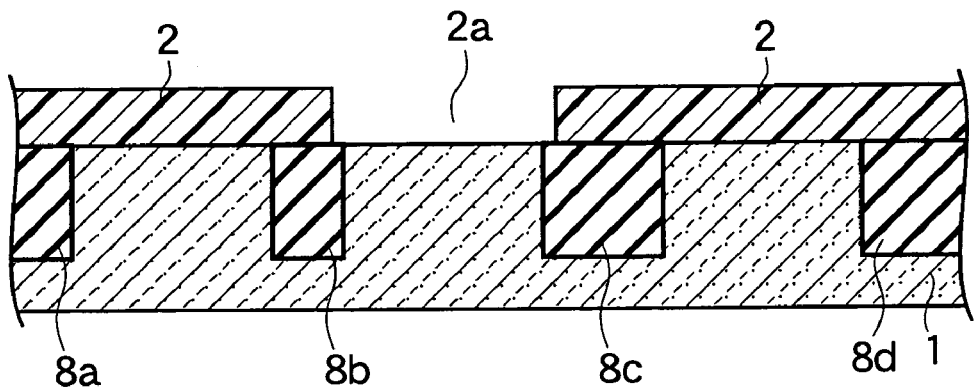
FIGS. 16–18 are cross-sectional views explaining a processing method according to a second modification of the second embodiment of the present invention.

(1) First, as shown in FIG. 16, a photoresist is coated on a surface of a Si substrate 1 in which isolation insulating films 8a to 8d are formed. A resist film 2 having an opening 2a aligned with a region between the isolation insulating films 8b and 8c is formed by a photolithography process.

Figure 17:
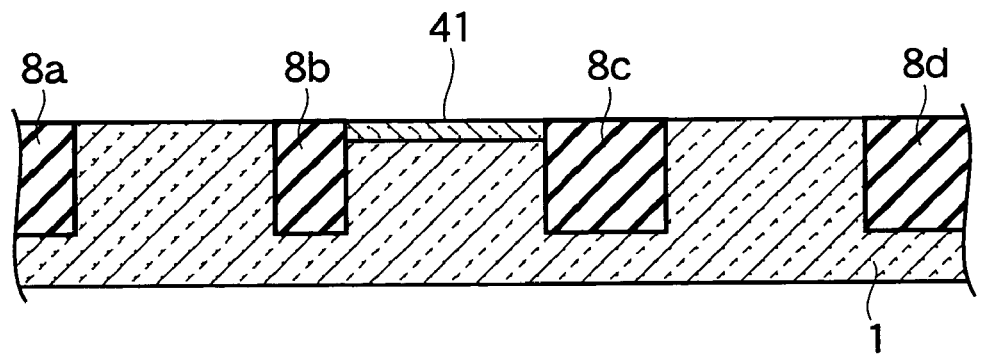

(2) As shown in FIG. 17, ion implantation or plasma doping of a halogen element such as F, Cl, Br, and I, or oxygen is performed on the Si substrate 1 using the opening 2a in the resist film 2. Thus, a doped layer 41, which is doped to the surface layer of the Si substrate 1 in a range from $1*10^{13}$ cm$^{-2}$ to $5*10^{14}$ cm$^{-2}$, is formed.

Figure 18:
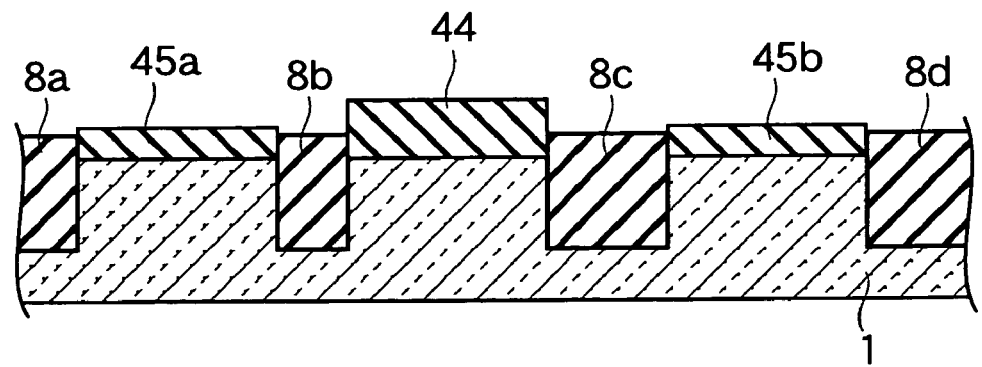

(3) Next, the Si substrate 1, in which the doped layer 41 is formed, is set in a first cassette chamber 10 to be transferred to the susceptor 12a in the first processing chamber 1a by a transfer robot 31. Thereafter, a flash lamp light irradiates the entire surface of the Si substrate 1 while oxidation gas is supplied thereto. As a result, as shown in FIG. 18, a first insulating film 44 is formed on the doped layer 41 between the isolation insulating films 8b and 8c. Moreover, second insulating films 45a and 45b thinner than the first insulating film 44 are formed between the isolation insulating films 8a and 8b and between the isolation insulating films 8c and 8d, respectively.

The second modification of the second embodiment makes it possible to form ultra thin insulating film layers having different thicknesses in desired regions of the Si substrate 1.

Moreover, using nitrogen as a dopant instead of the halogen element or oxygen decelerates a thermal oxidation rate in the doped layer with nitrogen. Thus, a local formation of the doped layer with nitrogen makes it possible to form a thinner thermal film in a region of the doped layer, compared with a region doped without nitrogen.

THIRD EMBODIMENT

Figure 19:
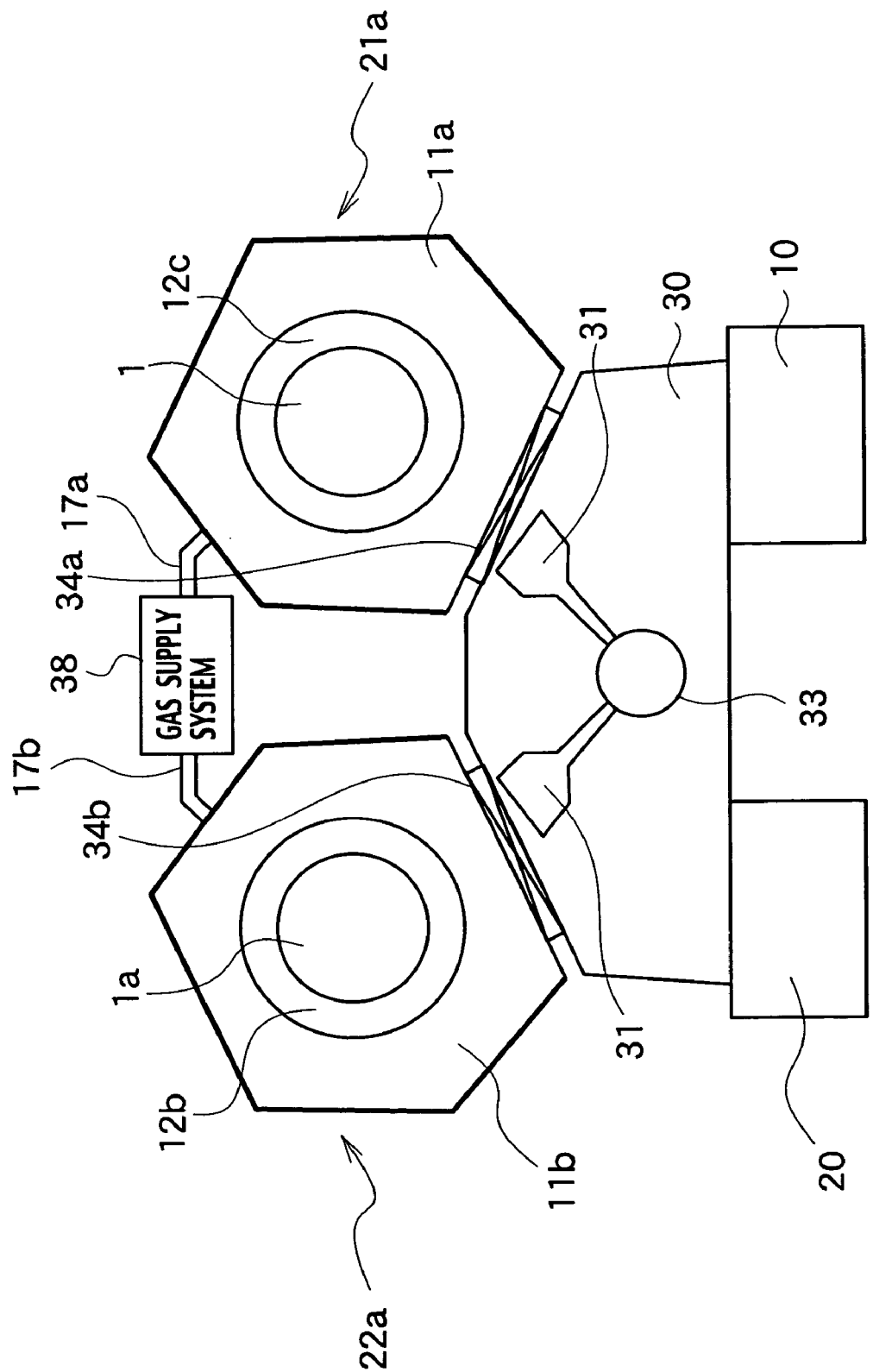
FIG. 19 is a schematic view depicting an example of a manufacturing apparatus according to a third embodiment of the present invention.

As shown in FIG. 19, a manufacturing apparatus according to a third embodiment of the present invention includes first and second processing apparatuses 21a and 22a. In the second embodiment, the first and second processing apparatuses 21 and 22 are both used to form the insulting film. The third embodiment differs from the second embodiment in that a pretreatment of removing a native oxide film on the surface of a substrate 1 is performed in the first processing apparatus 21a, and a processing of forming an insulating film is performed in the second processing apparatus 22a. Other than that, the third embodiment is the same as the second embodiment. Thus, redundant descriptions will be omitted.

Figure 20:
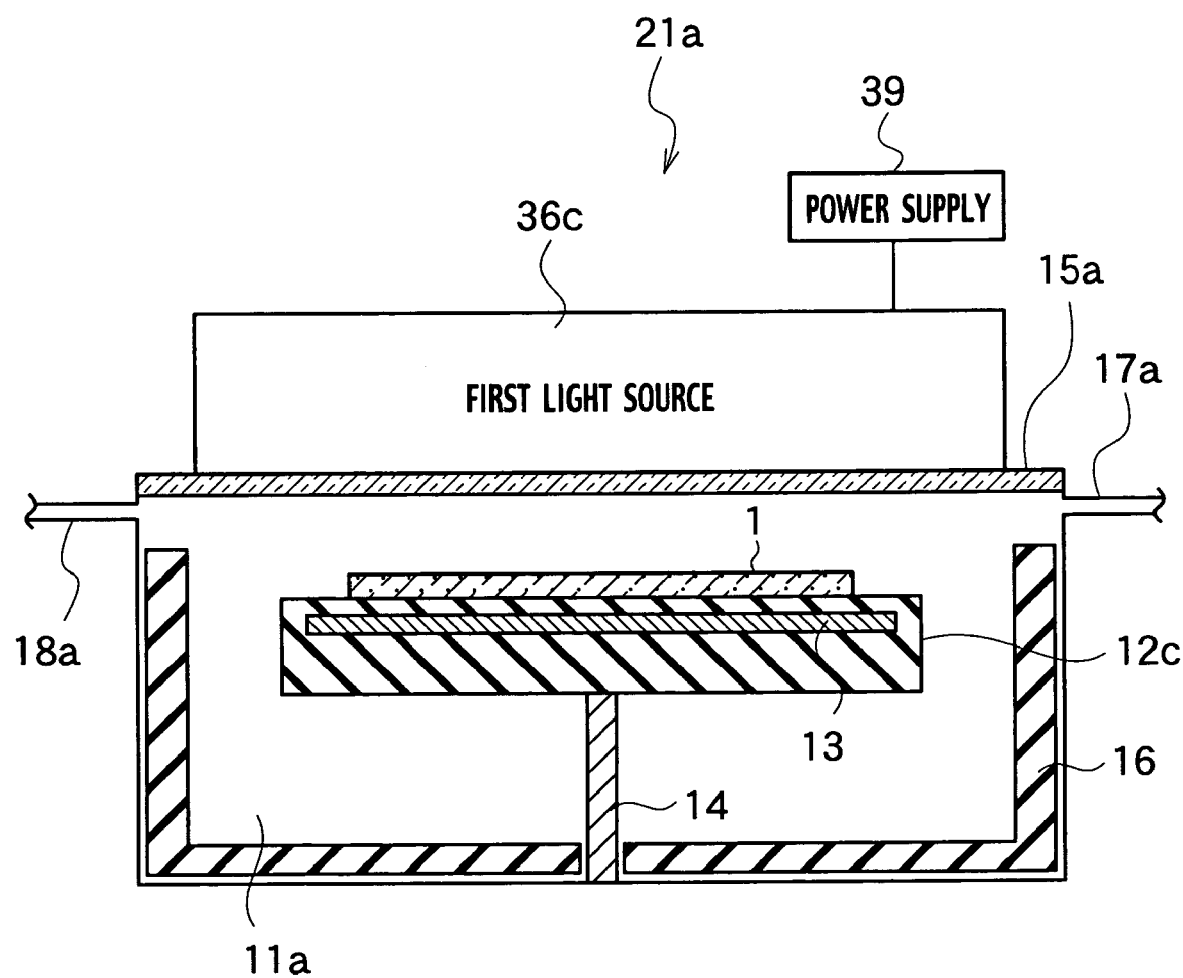
FIG. 20 is a schematic view depicting an example of a first processing apparatus according to the third embodiment of the present invention.

In the first processing apparatus 21a, pretreatment gas for removing a native oxide film on the surface of a substrate 1 loaded on a first susceptor 12a is supplied from a gas supply system 38. For pretreatment gas, reduction gas such as $H_2$ gas, mixed gas containing $H_2$, compound gas containing $H_2$, and the like, or reactive gas such as mixture of H2O and HF gases, mixture of inert gas such as xenon fluoride (XeF) or the like and halogen gas can be used. When the reduction gas containing $H_2$ is used for the pretreatment of removing a native oxide film, $H_2$ is activated to be hydrogen radical (H*), hydrogen ion ($H^+$) or the like. H* or $H^+$ can easily react with the native oxide film to remove the film. As shown in FIG. 20, in the third embodiment, the activation reaction of $H_2$ may be enhanced by use of a first main heater 36c which is a flash lamp having a plurality of emission wavelengths including ultraviolet rays, for example, in a range from 200 nm to 800 nm so as to excite $H_2$.

A first susceptor 12c is made of quartz or the like and has a heater therein for heating a substrate 1. The susceptor 12c may be AlN, ceramic, stainless steel or the like the surface of which being protected by quartz. Moreover, when a gas including halogen is used as a reactive gas, a material having resistance against halogen, such as a ceramic or polytetrafluoroethylene (PTFE) resin, may be used as the susceptor 12c. When PTFE is used for the first susceptor 12c, an processing temperature is equal to or less than 300° C.

Figure 21:
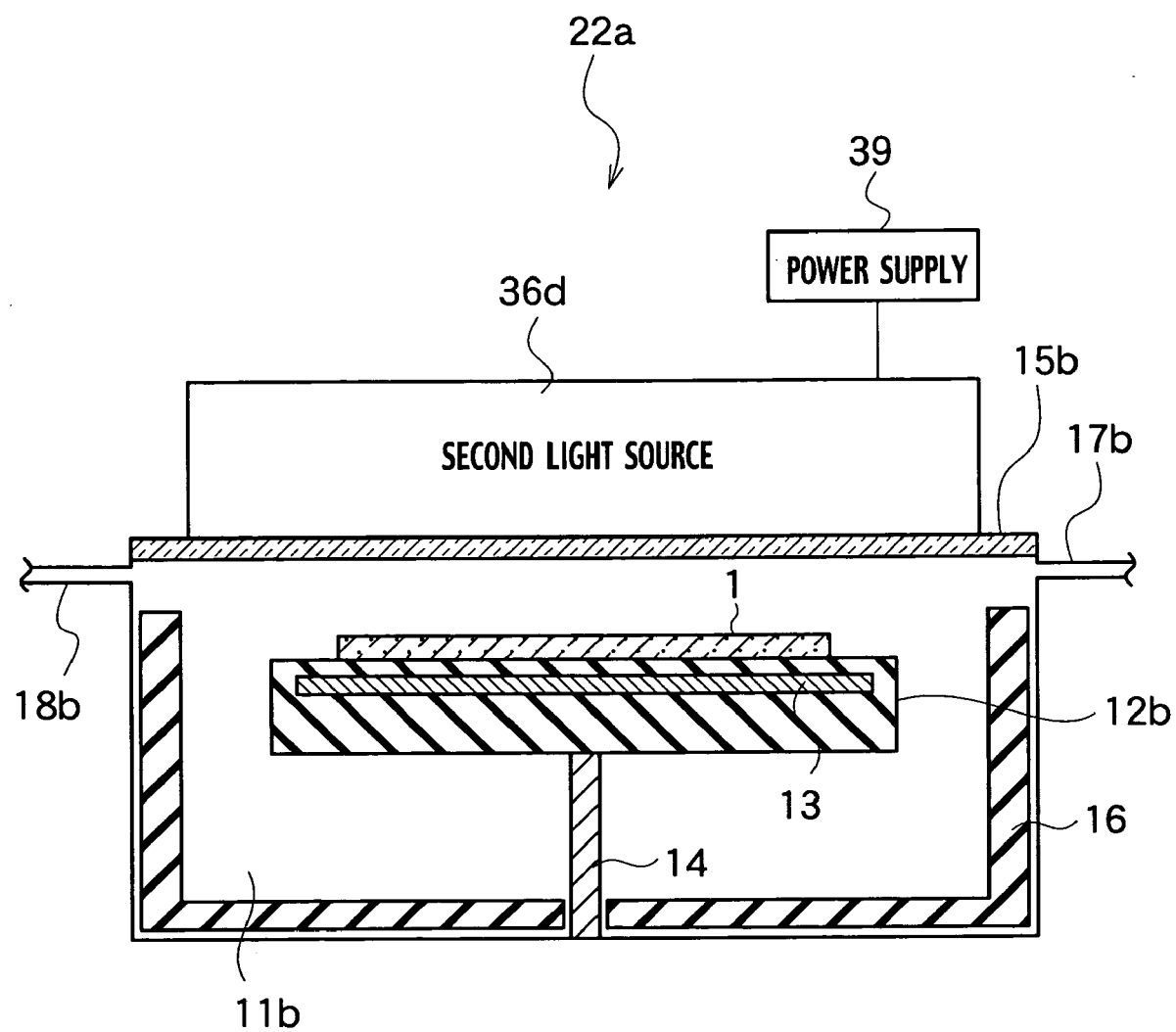
FIG. 21 is a schematic view depicting an example of a second processing apparatus according to the third embodiment of the present invention.

As shown in FIG. 21, a second processing apparatus 22a has a second main heater 36d for forming an insulating film. For the second main heater 36d, for example, a flash lamp is used to irradiate and heat the substrate with pulsed light.

A manufacturing apparatus according to the third embodiment makes it possible to form an insulating film by performing a pretreatment of removing a native oxide film on the substrate 1, and therefore, an ultra thin insulating film with the thickness of 2 nm or less can be formed with high controllability.

Figure 22:
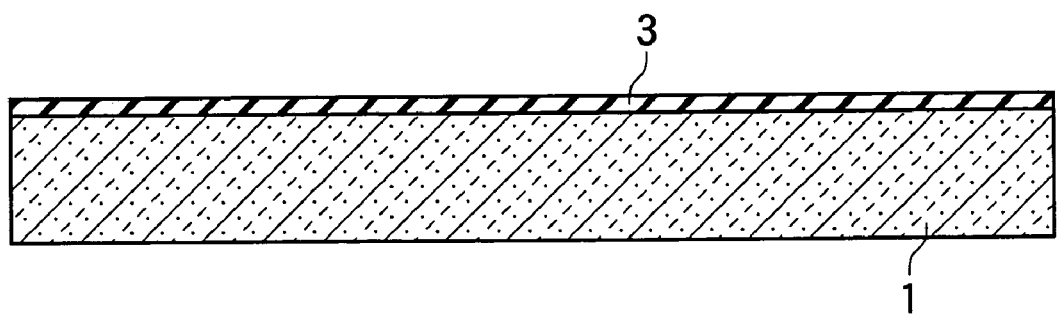
FIGS. 22–24 are cross-sectional views explaining a processing method according to the third embodiment of the present invention.
Figure 23:
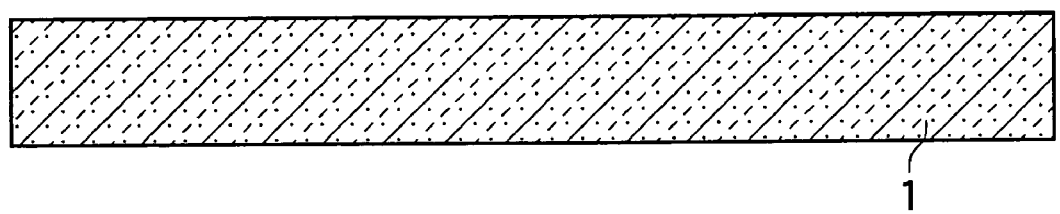
Figure 24:
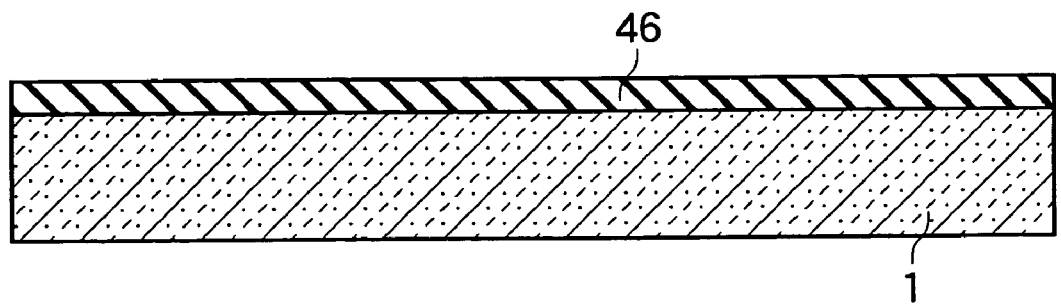

The method of forming an insulating film according to the third embodiment will be described with reference to FIGS. 22 to 24.

(1) In a first cassette chamber 10 shown in the FIG. 19, a wafer cassette storing a Si substrate 1, from which a native oxide film is removed by a wet cleaning, is placed. The Si substrate 1 is transferred to the first processing chamber 11a in the first processing apparatus 21a from the first cassette chamber 10 through the transfer chamber 30 by the transfer robot 31.

(2) The Si substrate 1 transferred to the first processing chamber 11a, is loaded on the first susceptor 12c shown in FIG. 20 to be preheated by an auxiliary heater 13. When the preheating temperature ranges from 200° C. to 650° C. inclusive, inert gas such as N2 or Ar is supplied to the semiconductor substrate 1 to purge moisture and atmospheric components adhered on the surface layer of the Si substrate 1. Note that, as shown in FIG. 22, a new native oxide film 3 with a thickness of approximately 0.5 nm is formed on the surface of the Si substrate 1 before or during preheating.

(3) The pretreatment of the surface of the Si substrate 1 is performed by supplying a reduction gas such as $H_2$ or a mixture gas containing $H_2$ to the surface of the Si substrate 1 after the preheating temperature stabilizes to within ±5° C. In pretreatment, while the reduction gas is supplied to the Si substrate 1, the first main heater 36c is turned on. The first main heater 36c irradiates the Si substrate 1 with flash lamp light for approximately 0.5 ms to 50 ms to heat the substrate 1 to approximately 900° C. to 1200° C. In the third embodiment, the first main heater 36c turns on for approximately 1 ms, and the surface temperature of the Si substrate 1 is measured by a high speed pyrometer and is approximately 1100° C. H2 gas is activated by ultraviolet components included in light from the first main heater 36c to generate H*, $H^+$ or the like. The generated H*, $H^+$ or the like reacts with the heated native oxide film 3 to decompose and remove the native oxide film 3. As a result, as shown in the FIG. 23, the surface of the Si substrate 1 is exposed. Instead of the $H_2$ gas, the gas including halogen such as HF, fluoride ($F_2$), argon fluoride (ArF), krypton fluoride (KrF), XeF, hydrogen chloride (HCl), chloride ($Cl_2$), hydrogen bromide (HBr), hydrogen iodide (HI) or iodide ($I_2$), may be supplied to the surface of the Si substrate 1 to remove the native oxide film 3.

(4) Next, the pretreated Si substrate 1 is transferred from the first processing chamber 11a to the second processing chamber 11b in the second processing apparatus 22a by the transfer robot 31. The Si substrate 1 is preheated at, for example, 300° C. to 550° C. on the second susceptor 12b. The inert gas is supplied to the Si substrate 1 during preheating.

(5) After the preheating temperature stabilizes, oxidation gas is supplied to the surface of the Si substrate 1. Thereafter, the second main heater 36d is turned on and irradiates the Si substrate 1 with, for example, the irradiation energy density of 20 J/cm$^{-2}$ to 30 J/cm$^{-2}$, for approximately 1 ms to heat the Si substrate 1 at approximately 1050° C. A surface layer of the Si substrate 1 is thermally oxidized by the thermal treatment of the first main heater 36a. As a result of setting the number of the irradiation of the second main heater 36d to 4, as shown in FIG. 24, an insulating film 46 with the thickness of, for example, approximately 0.5 nm is formed on the Si substrate 1.

(6) The Si substrate 1, where the insulating film 46 is formed, is transferred to the second cassette chamber 20 by the transfer robot 31. In the second cassette chamber 20, the Si substrate is stored in the wafer cassette.

Figure 25:
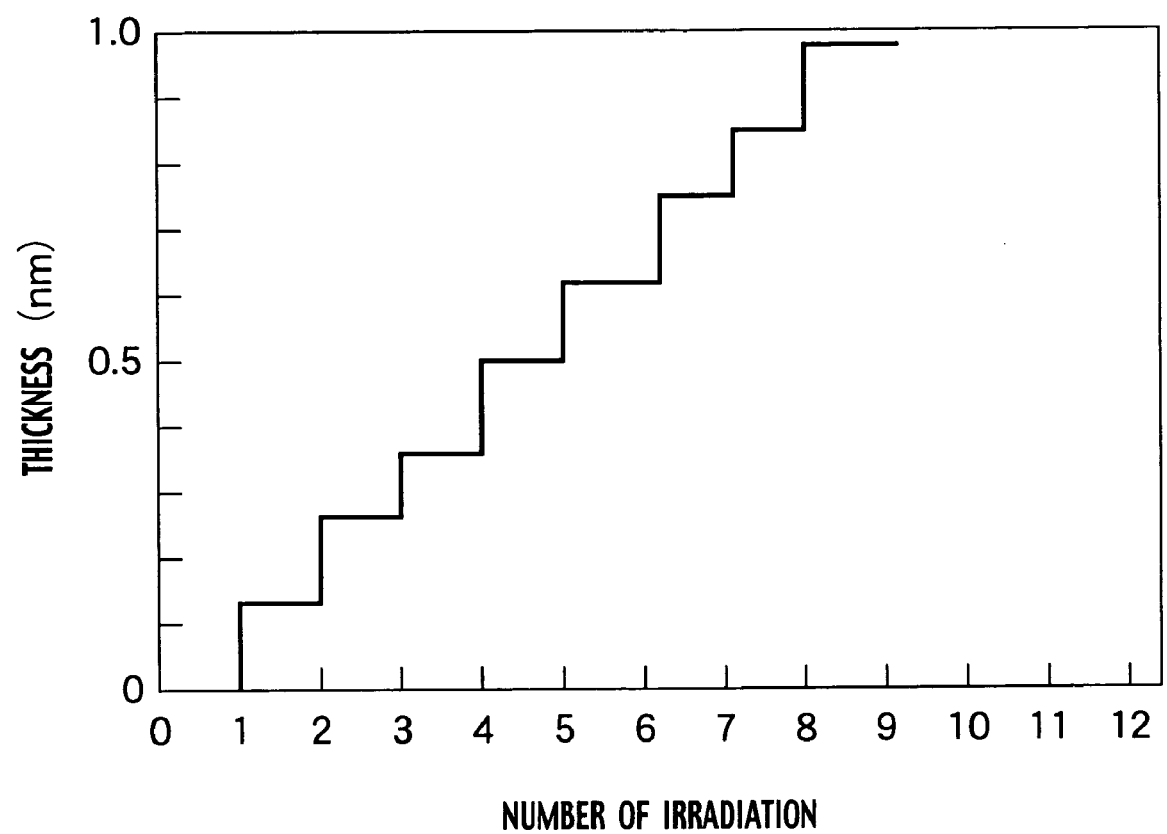
FIG. 25 is a graph depicting an example of a relationship between the thickness of an insulating film formed by the processing method and the number of irradiation by a main heater according to the third embodiment of the present invention.

In the third embodiment, the pretreatment of removing the native oxide film 3 formed on the Si substrate 1 is performed in the first processing chamber 11a in advance of forming the insulating film. Accordingly, as shown in FIG. 25, in the oxidation processing performed in the second processing chamber, the thickness of the oxide film grows stepwise from approximately 0 by a layer unit of 0.1 nm to 0.14 nm in accordance with an increase in the number of irradiation by the flash lamp light. Thus, the third embodiment makes it possible to form an ultra thin insulating film with a thickness of 0.5 nm or less.

Herein, the oxidation processing is performed for the Si substrate 1 in the second processing chamber 11b. A SiON film may certainly be formed by additionally performing the nitridation processing in the second processing chamber 11b.

The third embodiment makes it possible to form an insulating film on the surface of the Si substrate 1, from which the native oxide film 3 has been removed. Although, for example, an infrared lamp such as a halogen lamp is used as the second main heater 36b in the second processing chamber 11b, it is possible to form an ultra thin insulating film having an EOT of approximately 1 nm with excellent electrical characteristics.

As described above, the method of forming an insulating film according to the third embodiment makes it possible to form an ultra thin insulating film having an EOT of 1 nm or less with high repeatability and excellent electrical characteristics.

Next, for a method of manufacturing an electronic device to which the method of forming an insulating film according to the third embodiment is applied, the manufacturing steps of a metal-oxide-semiconductor field effect transistor (MOSFET) will be described with reference to a flowchart in FIG. 26 and sectional views of transistors in FIGS. 27 to 33.

Figure 26:
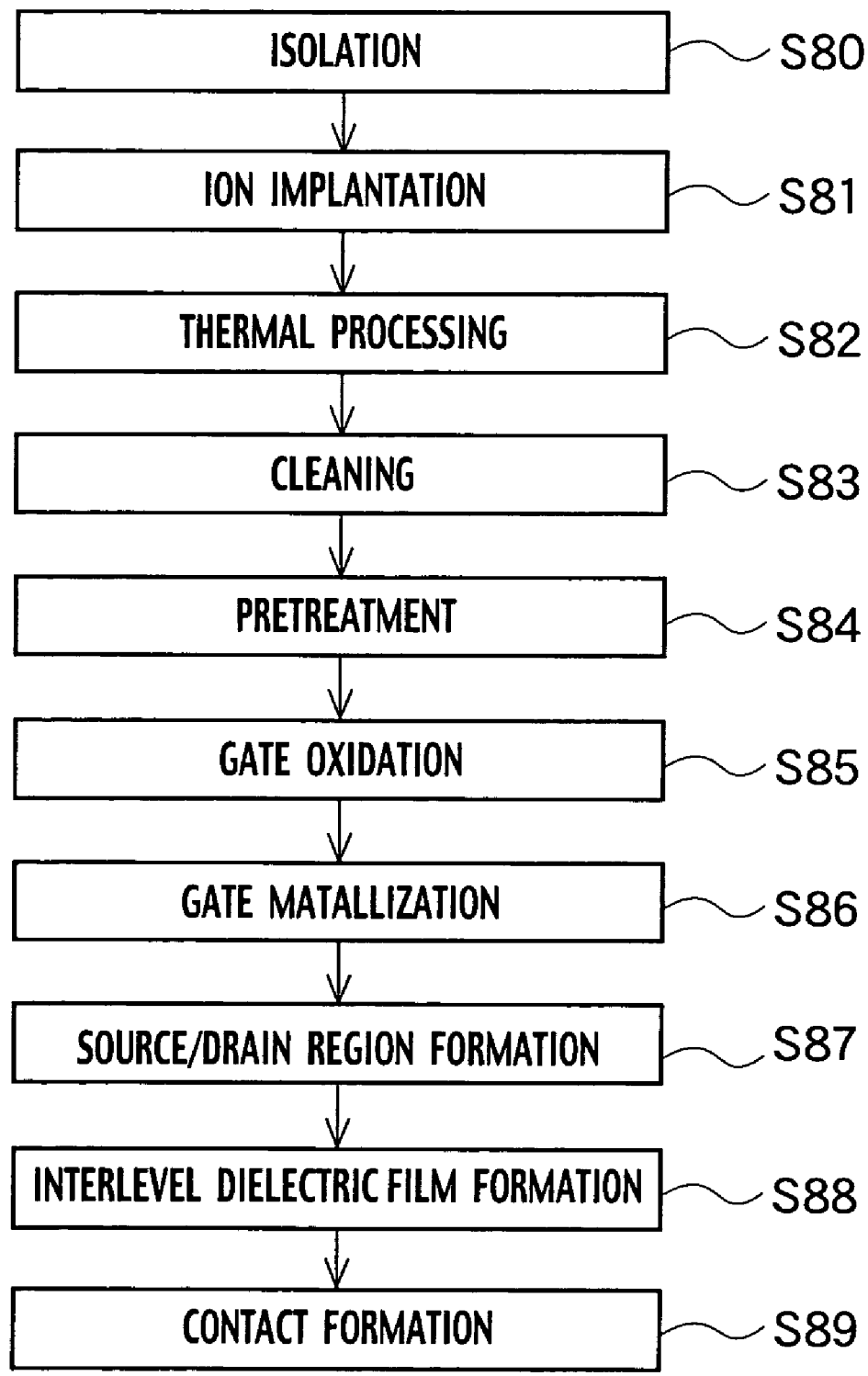
FIG. 26 is a flowchart illustrating an example of a manufacturing method of an electronic device according to the third embodiment of the present invention.
Figure 27:
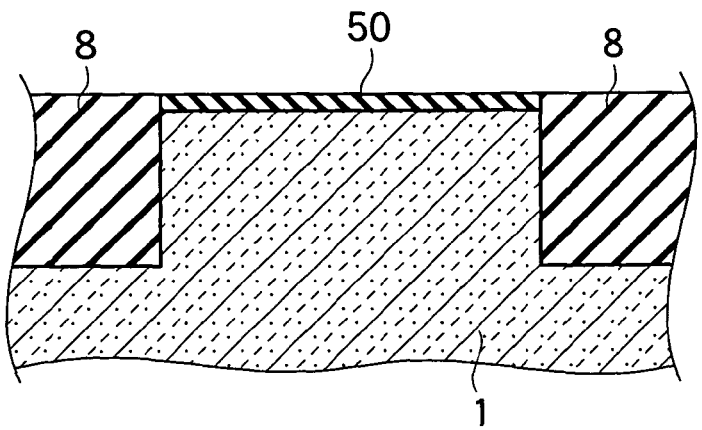
FIGS. 27–33 are cross-sectional views explaining a manufacturing method of the electronic device according to the third embodiment of the present invention.

(1) First, in step S80 in FIG. 26, an isolation insulating film 8 including a shallow trench isolation (STI) is formed on a Si substrate 1 such as a p type single crystal silicon. A sacrificial oxide film 50 with the thickness of approximately 10 nm is formed as a dummy by using a thermal oxidation method in a surface region between the isolation insulating films 8 of the Si substrate 1 (FIG. 27).

Figure 28:
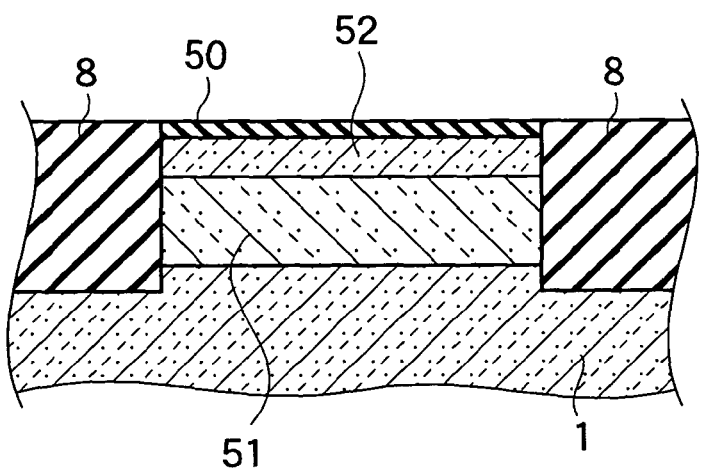

(2) In step S81, photolithography and ion implantation processes are performed in combination. The ion implantation of well impurities and channel impurities are performed into a well region and a channel region, respectively. First and second ion implantation layers 51 and 52 are introduced (FIG. 28). The conditions of the ion implantation is that, for p-channel MOSFET, for example, n type dopant such as phosphorus (P) is implanted in the well region with $2 \times 10^{13}$ to $1 \times 10^{14}$ cm$^{-2}$ at 400 to 500 keV, and subsequently, to the channel region with $1 \times 10^{13}$ to $1 \times 10^{14}$ cm$^{-2}$ at 200 to 300 keV. Meanwhile, for n-channel MOSFET, p type dopant such as boron (B) is implanted to the well region with $1 \times 10^{13}$ to $1 \times 10^{14}$ cm$^{-2}$ at 200 to 300 keV, and subsequently, to the channel region at $1 \times 10^{13}$ to $1 \times 10^{14}$ cm$^{-2}$ at 100 to 200 keV.

Figure 29:
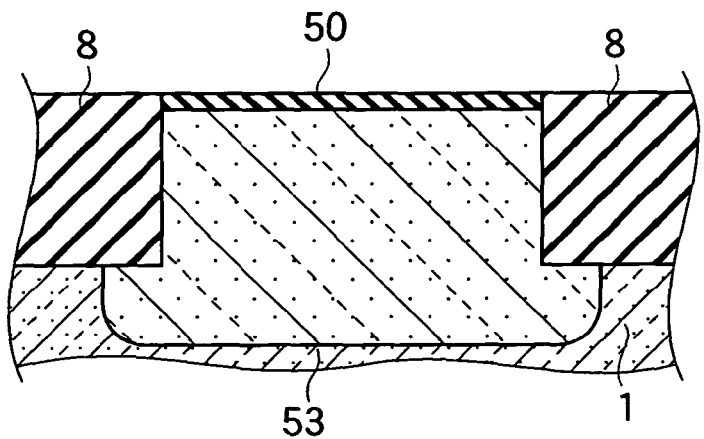

(3) In step S82, after the ion implantation, the anneal processing is performed at approximately 1000° C. to 1100° C. for about 10 s to 20 s by use of a halogen lamp annealing apparatus to diffuse and activate impurity atoms introduced to the first and second ion implantation layers 51 and 52. Thus, a well 53 is formed (FIG. 29). Thereafter, in step S83, the sacrificial oxide film 50 is etched with HF or the like, and the Si substrate 1 is cleaned by dipping into a mixed solution of a sulfuric acid and a hydrogen peroxide or a dilute hydrofluoric acid solution. After the cleaning, the Si substrate 1 is stored to a wafer cassette and loaded in the first cassette chamber 10 of the manufacturing apparatus in FIG. 19.

Figure 30:
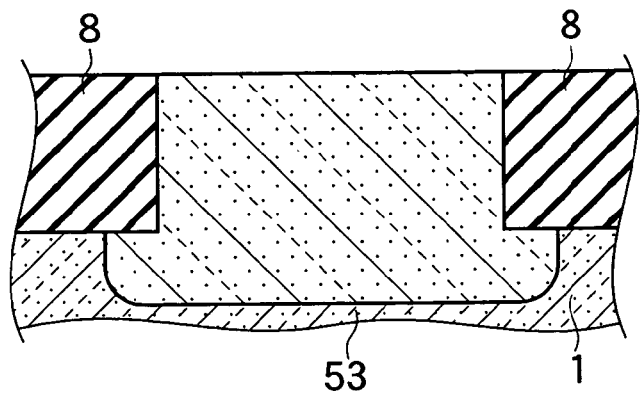

(4) Next, in step S84, the Si substrate 1 is loaded on the first susceptor 12c in the first processing chamber 11a in FIG. 20 by the transfer robot 31 in the transfer chamber 30, and pretreatment is performed. The Si substrate 1 is preheated to approximately 200° C. to 500° C. by the auxiliary heater 13 while inert gas is supplied. Thereafter, the surface of the Si substrate 1 is irradiated with light by the first main heater 36c while reduction gas containing H$_2$ is supplied to the surface of the Si substrate 1. The condition of the irradiation of the flash lamp is that, for example, the surface of the Si substrate 1 is irradiated for approximately 1 ms with an irradiation energy density of 20 to 30 J/cm$^{-2}$ to heat the Si substrate 1 to approximately 1050° C. H$_2$ included in the reduction gas is activated by ultraviolet components from the first main heater 36c to decompose and remove the native oxide film on the surface of the Si substrate 1 heated with a high temperature (FIG. 30). Although crystal defects remain, which are introduced to the Si substrate 1 during the ion implantation and are not completely recovered by the activation anneal, it is possible to further recover the crystal quality by thermal treatment by use of the first main heater 36c. As a result, the clean surface of the Si substrate 1 can be provided, on which the native oxide film does not exist and in which the crystal defects introduced during the ion implantation are reduced.

Figure 31:
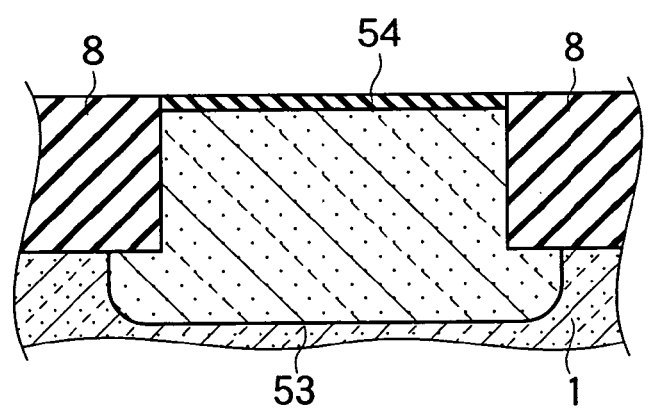

(5) In step S85, the Si substrate 1 is loaded on the second susceptor 12b in the second processing chamber 11b, transferred from the first processing chamber 11a by the transfer robot 31. The flash lamp light irradiates the Si substrate 1, for example, for eight times by use of the second main heater 36b while oxidation gas such as O$_2$ gas is supplied to the second processing chamber 11b. Thus, an oxide film 54 with a thickness of approximately 2 nm is formed (FIG. 31).

(6) After the oxide film 54 is formed, the transfer robot 31 carries the Si substrate 1 to the wafer cassette in the second cassette chamber 20 from the second processing chamber 11b. Next, in step S86, the Si substrate 1 is loaded in a CVD apparatus, a polysilicon film is deposited thereon, and a gate electrode 56 and a gate oxide film 55 are formed on the center of the region between the isolation insulating films 8 using photolithography and dry etching techniques.

Figure 32:
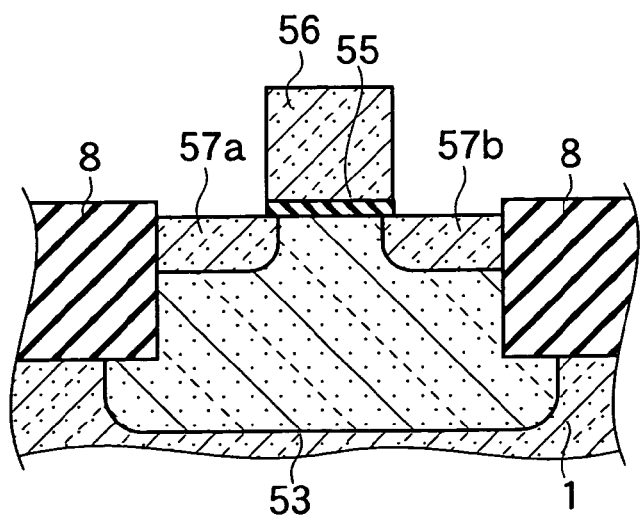

(7) In step S87, using ion implantation techniques, impurities of conductivity opposite to those introduced to the well 53 are introduced to the surface region of the well 53 by use of the gate electrode 56 as a mask. Thereafter, implanted impurities are activated by the annealing proces by use of the lamp annealing apparatus to form source/drain regions 57a and 57b (FIG. 32).

Figure 33:
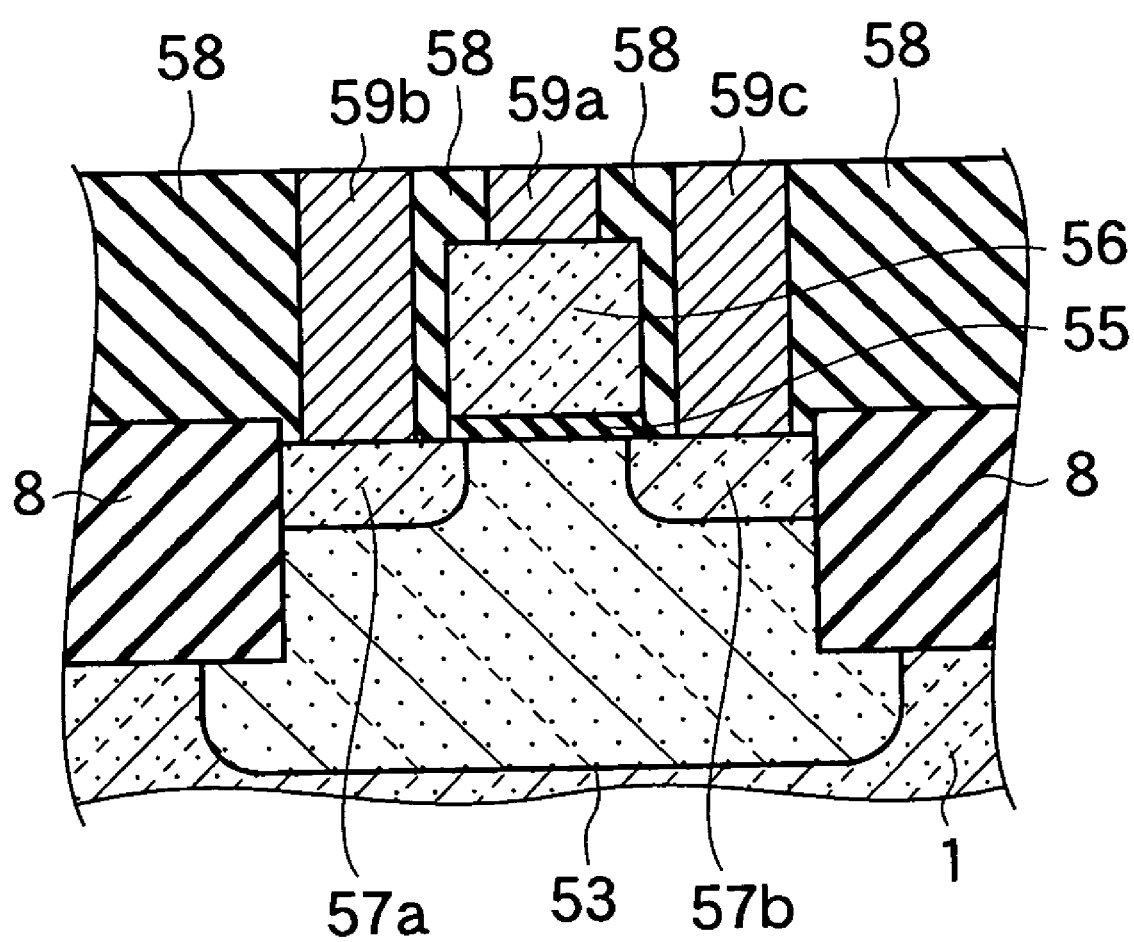

(8) In step S88, a thick insulating film is deposited using CVD or the like, and an interlayer insulating film 58 is formed, which has openings on the gate electrode 56 and the source/drain region 57a and 57b using photolithography and dry etching techniques. Thereafter, a metal such as aluminum (Al) is filled in the openings between the interlayer insulating films 58 using sputtering or the like to form contact electrodes 59a to 59c on the gate electrode 56 and the source/drain regions 57a and 57b, thereby completing the MOSFET (FIG. 33).

The reliability of the gate oxide film of the MOSFET thus manufactured is evaluated. For example, the elapsed time before the breakdown of the gate insulation is measured, by applying continuously voltage of −11 V to −10 V to the gate electrode. By extrapolating the result, an expected lifetime for a dielectric breakdown, where −3 V is applied to the gate electrode, is estimated. The longer the lifetime is, the better the reliability is.

The estimated lifetime for the dielectric breakdown of the MOSFET is compared with that manufactured by the method which is different only in the pretreatment of the step S84 in FIG. 26. The thicknesses of all the gate oxide films are approximately 2 nm. In the MOSFET according to the third embodiment, the estimated dielectric breakdown lifetime is approximately 15 years, thereby achieving high reliability. By contrast, for example, in a MOSFET which is heated by the irradiation of an infrared lamp while a reduction gas is supplied in the pretreatment, the estimated dielectric breakdown lifetime is approximately 7 years. Since the infrared light cannot activate $H_2$ included in the reduction gas, the decomposition efficiency of the native oxide film is low. Moreover, in a MOSFET which is pretreated by the irradiation of ultraviolet rays substantially at room temperature while reduction gas is supplied, the estimated dielectric breakdown lifetime is approximately 8 years. Since the surface temperature of the Si substrate 1 is low when ultraviolet is irradiated at room temperature, the reaction efficiency with activated gas is reduced.

Although the ultra thin oxide film is formed by use of the flash lamp light while oxidation gas is supplied in the second processing chamber 11b in the third embodiment, a SiON film may certainly be formed by use of the nitridation gas such as NO gas or nitrous oxide ($N_2O$) gas. In addition, the similar effect can certainly be obtained when the MISFET is manufactured by use of a SiON film, a HfSiON/SiON composite film or the like as the gate insulating film. Further, the Si substrate 1 is subjected to the thermal processing at, for example, 950° C. to 1200° C. by a laser unit having a plurality of laser sources such as a combination of laser sources having two or more different emission wavelengths between 200 nm and 900 nm, an infrared lamp heating apparatus or the like in the second processing chamber 11b, instead of the flash lamp. Thus, the gate insulating film may be formed. Considering flash heating properties, since the flash lamp or the laser unit having the plurality of laser sources can heat to higher temperature within a shorter time than the infrared lamp, an insulating film having better properties can be formed by the flash lamp or the laser unit. Since the native oxide film can be removed in the pretreatment immediately before forming an insulating film in the third embodiment, an ultra thin insulating film having an EOT of approximately 1 nm can be formed.

OTHER EMBODIMENTS

In the first to third embodiments, descriptions have been given of the case using a Si substrate. The substrate 1, however, is not limited to the Si substrate, and it may be a group IV—IV compound semiconductor substrate such as silicon germanium (SiGe) or silicon germanium carbon (SiGeC), a group III–V compound semiconductor substrate such as gallium arsenide (GaAs), gallium phosphide (GaP), indium arsenide (InA), indium phosphide (InP) or gallium nitride (GaN), or a group II–VI compound semiconductor substrate such as zinc selenide (ZnSe). Furthermore, an insulating substrate, a metal substrate or the like may certainly be used. In addition, an electronic device is not limited to a semiconductor device including such as a MOSFET or MISFET. It may certainly be a liquid crystal display, a magnetic storage device and a head for reading out the same, or a surface acoustic wavedevice.

In the processing chamber or manufacturing apparatus according to the first to third embodiments, the processings are performed substantially at atmospheric pressure. However, processing pressure is not limited to the atmospheric pressure. For example, it is obvious that, by connecting a vacuum pump to the first or second processing chamber, processing pressure may be varied from being slightly lower than atmospheric pressure to low pressure of about 50 kPa.

Various modifications will become possible for those skilled in the art after storing the teachings of the present disclosure without departing from the scope thereof.

What is claimed is:

1. An annealing furnace, comprising:
   a processing chamber configured to store a substrate;
   a susceptor located in the processing chamber so as to load the substrate and having an auxiliary heater for heating the substrate at 650° C. or less, the susceptor having a surface made of quartz;
   a gas supply system having a variety of gas sources required for a thermal processing on the substrate, the gas sources including one of a reduction gas and a gas containing halogen for removing a native oxide film formed on the substrate;
   an introduction conduit connected to the gas supply system configured to supply a gas in parallel to a surface of the substrate;
   an exhaust conduit facing the introduction conduit configured to exhaust the gas from the processing chamber;
   a protective member made of quartz configured to prevent oxidation or corrosion on side and bottom inner walls in the processing chamber;
   a transparent window located on an upper part of the processing chamber facing the susceptor; and
   a main heater configured to irradiate a pulsed light on the surface of the substrate to heat the substrate from the transparent window, the pulsed light having a pulse duration of approximately 0.1 ms to 200 ms and having a plurality of emission wavelengths.

2. The annealing furnace of claim 1, wherein the main heater is one of a flash lamp and a laser unit having a plurality of laser sources for irradiating with a light having an irradiation energy density in a range of approximately 5 $J/cm^2$ to 100 $J/cm^2$.

3. The annealing furnace of claim 1, wherein the gas supply system supplies at least one of an oxidation gas and a nitridation gas for forming an insulating film on the substrate.

4. The annealing furnace of claim 1, wherein the emission wavelengths include ultraviolet components.

5. The annealing furnace of claim 3, wherein the gas supply system supplies one of the oxidation gas and the nitridation gas after removing the native oxide film formed on the substrate.

6. A manufacturing apparatus, comprising:
   a first cassette chamber to place a wafer cassette for storing a substrate;
   a transfer chamber connected to the first cassette chamber, having a transfer robot for transferring the substrate;

a first processing apparatus having a first processing chamber connected to the transfer chamber and configured to store the substrate, a first susceptor located in the first processing chamber so as to load the substrate transferred by the transfer robot, a first introduction conduit supplying a first gas in parallel to a surface of the substrate, the first gas including one of a reduction gas and a gas including halogen for removing a native oxide film formed on the substrate a first exhaust conduit facing the introduction conduit so as to exhaust the first gas from the processing chamber, a protective member made of quartz configured to prevent oxidation or corrosion on side and bottom inner walls in the first processing chamber, a first transparent window located on an upper part of the first processing chamber, and a first main heater irradiating a pulsed light on the surface of the substrate to heat the substrate from the first transparent window, the pulsed light having a duration of approximately 0.1 ms to 200 ms and having a plurality of emission wavelengths; and a second cassette chamber to place another wafer cassette storing the substrate transferred from the first processing apparatus by the transfer robot.

7. The manufacturing apparatus of claim 6, wherein the first main heater irradiates with a light having an irradiation energy density in a range of approximately 5 J/cm$^2$ to 100 J/cm$^2$.

8. The manufacturing apparatus of claim 6, further comprising:

a second processing apparatus having a second processing chamber connected to the transfer chamber and configured to store the substrate, a second susceptor located in the second processing chamber so as to load the substrate transferred by the transfer robot, a second introduction conduit supplying a second gas to the surface of the substrate, a second transparent window located on an upper part of the second processing chamber, and a second main heater irradiating a light on the surface of the substrate to heat the substrate from the second transparent window and having a plurality of emission wavelengths.

9. The manufacturing apparatus of claim 8, wherein the second main heater irradiates the light having an irradiation energy density in a range of approximately 5 J/cm$^2$ to 100 J/cm$^2$.

10. The manufacturing apparatus of claim 8, wherein the second introduction conduit supplies at least one of an oxidation gas and a nitridation gas for forming an insulating film on the substrate.

11. The manufacturing apparatus of claim 6, wherein the emission wavelengths of the first main heater include ultraviolet components.

12. An annealing method, comprising:

introducing at least one of an oxidation gas and a nitridation gas in parallel to a surface of a substrate loaded on a susceptor in a processing chamber from an introduction conduit to an exhaust conduit, the introduction conduit and the exhaust conduit each connected to a top portion of sidewalls in the processing chamber and facing each other, after a pretreatment of removing a native oxide film on the surface of the substrate by supplying one of a reduction gas and a gas including halogen; and heating the surface of the substrate with a pulse duration of approximately 0.1 ms to 200 ms to perform at least one of oxidation and nitridation.

13. The annealing method of claim 12, wherein the heating is performed by irradiation of a light having an irradiation energy density in a range of approximately 5 J/cm$^2$ to 100 J/cm$^2$.

14. The annealing method of claim 13, wherein the irradiation of the light is performed for a plurality of times.

15. The annealing method of claim 13, wherein emission wavelengths of the light includes ultraviolet components.

16. The annealing method of claim 12, wherein the surface of the substrate is heated to a temperature range of approximately 950° C. to 1200° C. when measured by a pyrometer.

17. The annealing method of claim 12, wherein the heating is selectively performed by aligning a stencil mask having an opening above an upper side of the substrate.

18. The annealing method of claim 12, wherein the heating is performed by doping one of halogen, oxygen and nitrogen to a portion of the substrate.

19. A manufacturing method of an electronic device, comprising:

cleaning a substrate by a wet processing;

loading the substrate on a first susceptor in a first processing apparatus;

introducing a first gas in parallel to a surface of the substrate loaded on the first susceptor from an introduction conduit to an exhaust conduit, the introduction conduit and the exhaust conduit each connected to a top portion of sidewalls in the processing chamber and facing each other; and performing a first processing by heating a surface of the substrate with a pulse duration of approximately 0.1 ms to 200 ms, the first processing removing a native oxide film on the substrate by use of one of a reduction gas and a gas containing halogen as the first gas.

20. The manufacturing method of claim 19, wherein the heating of the first processing is performed by irradiating a first light having an irradiation energy density of approximately 5 J/cm$^2$ to 100 J/cm$^2$.

21. The manufacturing method of claim 19, wherein the surface of the substrate is heated to a temperature range of approximately 900° C. to 1200° C. when measured by a pyrometer.

22. The manufacturing method of claim 19, further comprising:

loading the substrate, which has been subjected to the first processing, on a second susceptor in a second processing apparatus;

introducing a second gas to the substrate loaded on the second susceptor; and performing a second processing by heating the surface of the substrate.

23. The manufacturing method of claim 22, wherein the heating of the second processing is performed by irradiating a second light with a pulse duration of approximately 0.1 ms to 200 ms having an irradiation energy density of approximately 5 J/cm2 to 100 J/cm2.

24. The manufacturing method of claim 22, wherein the second processing is to form a second insulating film by use of at least any one of an oxidation gas and a nitridation gas as the second gas.

25. The manufacturing method of claim 23, wherein the irradiation of the second light is performed a plurality of times.

26. The manufacturing method of claim 20, wherein emission wavelengths of the first light include ultraviolet components.

27. The manufacturing method of claim 22, wherein the surface of the substrate on the second susceptor is heated by an irradiation of a second light to a temperature range of approximately 950° C. to 1200° C. when measured by a pyrometer.

28. The manufacturing method of claim 27, wherein the heating of the second thermal processing is performed by the irradiation from a main heater having a plurality of emission wavelengths.

* * * * *

UNITED STATES PATENT AND TRADEMARK OFFICE
CERTIFICATE OF CORRECTION

| | |
|---|---|
| PATENT NO. | : 7,084,068 B2 |
| APPLICATION NO. | : 10/661564 |
| DATED | : August 1, 2006 |
| INVENTOR(S) | : Suguro et al. |

It is certified that error appears in the above-identified patent and that said Letters Patent is hereby corrected as shown below:

* Claim 6, column 17, line 9, change "substrate" to --substrate,--.

Claim 15, column 18, line 9, change "includes" to --include--.

Claim 23, column 18, line 63, change "5 J/cm2 to 100 J/cm2." to --5 $J/cm^2$ to 100 $J/cm^2$.--.

Signed and Sealed this

Twelfth Day of December, 2006

JON W. DUDAS
*Director of the United States Patent and Trademark Office*